United States Patent [19]
Tanaka et al.

[11] Patent Number: 5,923,707
[45] Date of Patent: Jul. 13, 1999

[54] REPRODUCING APPARATUS CAPABLE OF GENERATING CLOCK SIGNAL SYNCHRONIZED IN PHASE WITH REPRODUCED DATA

[75] Inventors: Yasuyuki Tanaka, Tokyo; Yoshiyuki Sasaki, deceased, late of Yokohama; Hana Sasaki, legal representative, Tokyo, all of Japan

[73] Assignee: Canon Kabushiki Kaisha, Tokyo, Japan

[21] Appl. No.: 08/704,909

[22] Filed: Aug. 30, 1996

[51] Int. Cl.$^6$ ........................................ G11B 5/09
[52] U.S. Cl. .................. 375/232; 374/375; 374/376; 360/51; 360/62; 386/13; 386/85; 331/11
[58] Field of Search ................. 360/51, 62, 65, 360/27; 375/232, 375, 376; 331/10, 11, 17, 20, 25, 27, 14; 386/13, 85; 369/59; 348/537, 497

[56] References Cited

U.S. PATENT DOCUMENTS 5,157,355  10/1992  Shikakura et al. .................. 331/11
5,525,935   6/1996  Joo et al. ............................ 331/11
5,774,290   6/1998  Sasaki et al. ....................... 360/51

*Primary Examiner*—Amanda Le
*Attorney, Agent, or Firm*—Robin, Blecker & Daley

[57] ABSTRACT

In an information signal recording and reproducing apparatus, reproduced data is equalized by an equalizer and a clock signal synchronized in phase with the reproduced data is generated. An equalizing characteristic of the equalizer is controlled according to a difference in frequency between the clock signal and the reproduced data, and a generating operation for the clock signal is controlled according to a phase difference between the clock signal and the reproduced data. The clock signal thus can be stably generated without being affected by variations of temperature and variations due to aging. The equalizer thus has an adequate equalizing characteristic. The apparatus includes a recording mode and a reproduction mode. In the recording mode, a recording clock signal is generated by a clock signal generating circuit and a digital signal is recorded by using the recording clock signal. In the reproduction mode, a reproducing clock signal which is synchronized in phase with a reproduced digital signal is generated by the clock signal generating circuit and the digital signal is reproduced by using the reproducing clock signal.

22 Claims, 21 Drawing Sheets

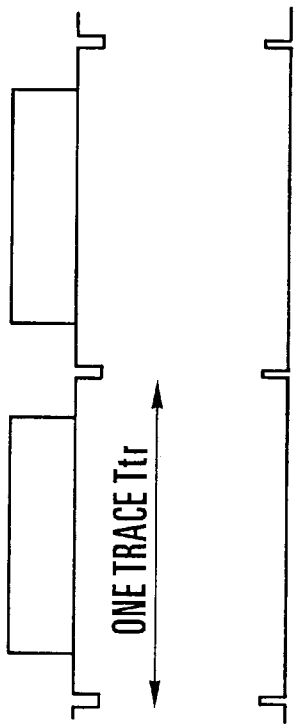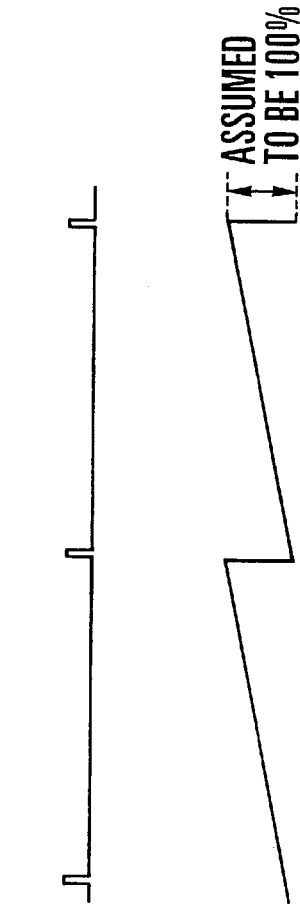

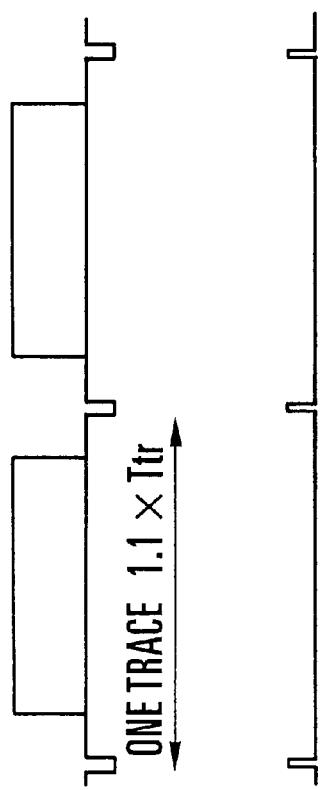
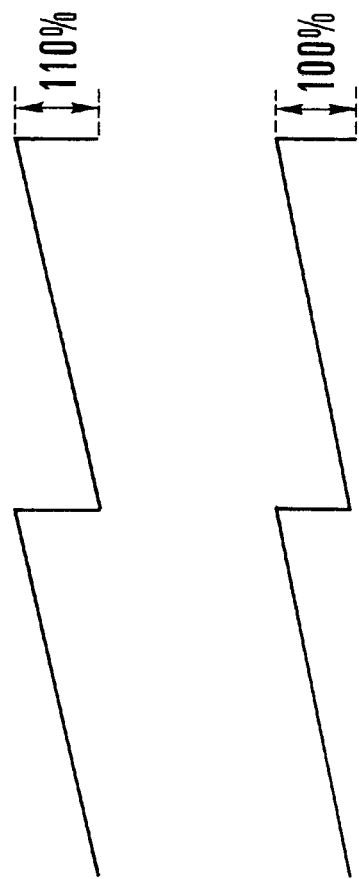
FIG. 5(a) RECORDING VIDEO SIGNAL
FIG. 5(b) OUTPUT OF TIMING SIGNAL FORMING CIRCUIT
FIG. 5(c) OUTPUT OF COUNTER (ANALOG INDICATION) ※BEFORE CONVERGENCE
FIG. 5(d) OUTPUT OF COUNTER (ANALOG INDICATION) ※AFTER CONVERGENCE

FIG. 12

TRUTH TABLE OF ph, ah, s, sign

| a b c d e | b - d | sign | ah | s | ph |
|---|---|---|---|---|---|
| 0 0 0 0 0 : | 0 0 0 | * | 1 | * | 1 |
| 1 0 0 0 0 : | 1 0 0 | * | 1 | + | 0 |
| 0 1 0 0 0 : | 0 1 0 | + | 0 | * | 1 |
| 1 1 0 0 0 : | 1 1 0 | + | 0 | * | 1 |
| 0 0 1 0 0 : | -1 0 1 | * | 1 | − | 0 |
| 1 0 1 0 0 : | 0 0 1 | * | 1 | − | 0 |
| 0 1 1 0 0 : | -1 1 1 | + | 0 | * | 1 |
| 1 1 1 0 0 : | 0 1 1 | + | 0 | * | 1 |
| 0 0 0 1 0 : | 0 -1 0 | − | 0 | * | 1 |
| 1 0 0 1 0 : | 1 -1 0 | − | 0 | * | 1 |
| 0 1 0 1 0 : | 0 0 0 | * | 1 | * | 1 |
| 1 1 0 1 0 : | 1 0 0 | * | 1 | + | 0 |
| 0 0 1 1 0 : | -1 -1 1 | − | 0 | * | 1 |
| 1 0 1 1 0 : | 0 -1 1 | − | 0 | * | 1 |
| 0 1 1 1 0 : | -1 0 1 | * | 1 | − | 0 |
| 1 1 1 1 0 : | 0 0 1 | * | 1 | − | 0 |
| 0 0 0 0 1 : | 0 0 -1 | * | 1 | + | 0 |
| 1 0 0 0 1 : | 1 0 -1 | * | 1 | + | 0 |
| 0 1 0 0 1 : | 0 1 -1 | + | 0 | * | 1 |
| 1 1 0 0 1 : | 1 1 -1 | + | 0 | * | 1 |
| 0 0 1 0 1 : | -1 0 0 | * | 1 | − | 0 |
| 1 0 1 0 1 : | 0 0 0 | * | 1 | * | 1 |
| 0 1 1 0 1 : | -1 1 0 | + | 0 | * | 1 |
| 1 1 1 0 1 : | 0 1 0 | + | 0 | * | 1 |
| 0 0 0 1 1 : | 0 -1 -1 | − | 0 | * | 1 |
| 1 0 0 1 1 : | 1 -1 -1 | − | 0 | * | 1 |
| 0 1 0 1 1 : | 0 0 -1 | * | 1 | + | 0 |
| 1 1 0 1 1 : | 1 0 -1 | * | 1 | + | 0 |
| 0 0 1 1 1 : | -1 -1 0 | + | 0 | * | 1 |
| 1 0 1 1 1 : | 0 -1 0 | + | 0 | * | 1 |
| 0 1 1 1 1 : | -1 0 0 | * | 1 | − | 0 |
| 1 1 1 1 1 : | 0 0 0 | * | 1 | * | 1 |

\* TAKING WHICHEVER

F I G. 14(a)
F I G. 14(b)
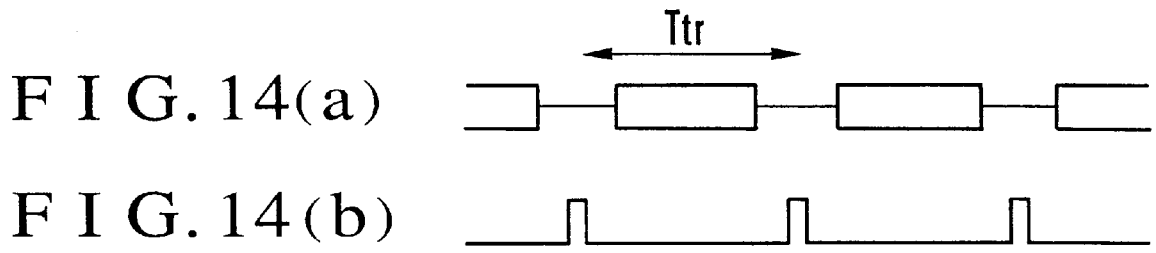
F I G. 15
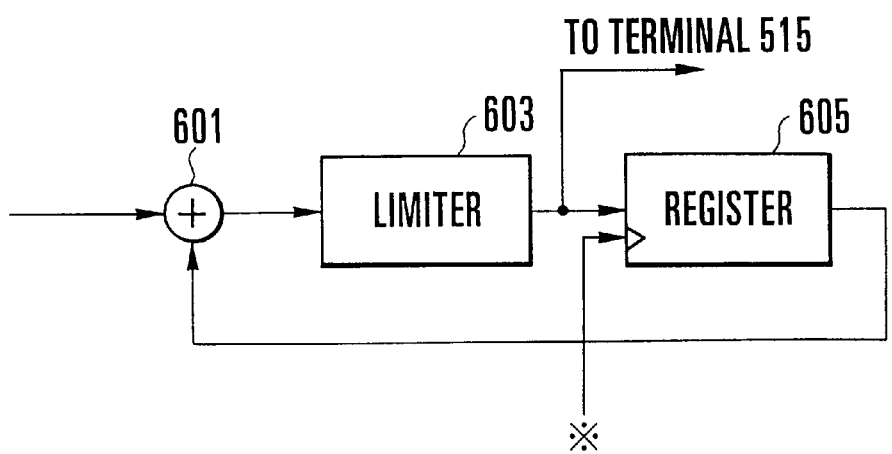

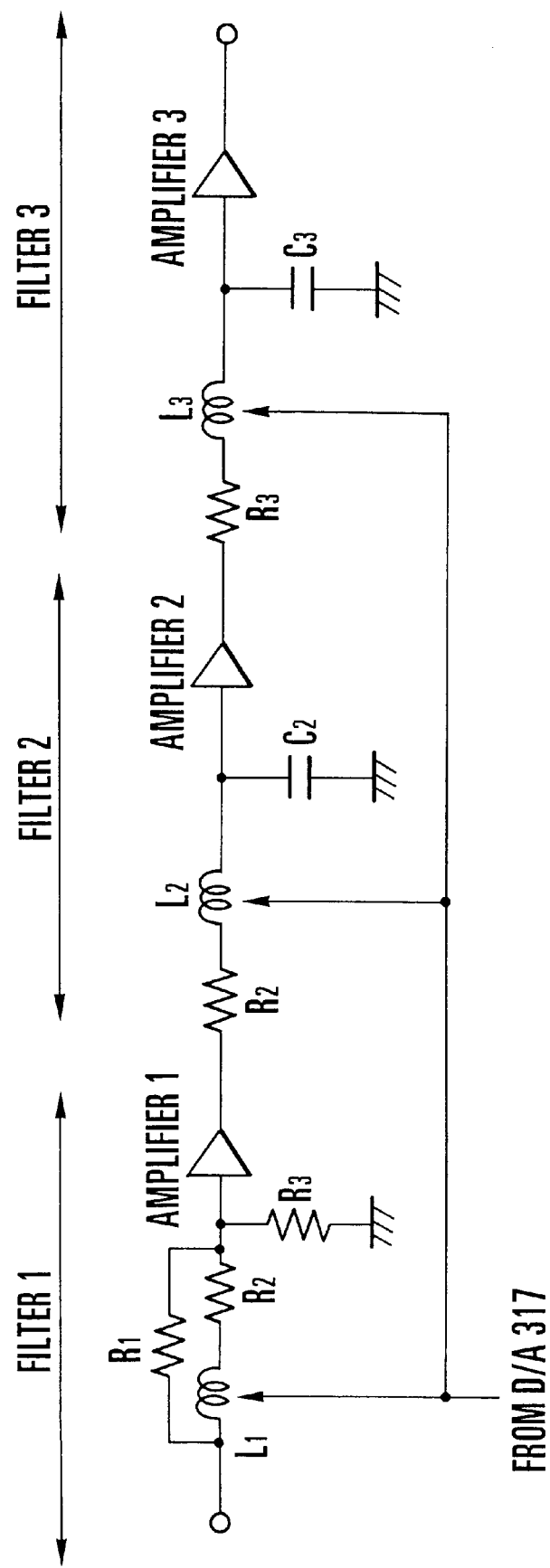
F I G. 16

F I G. 19(a)
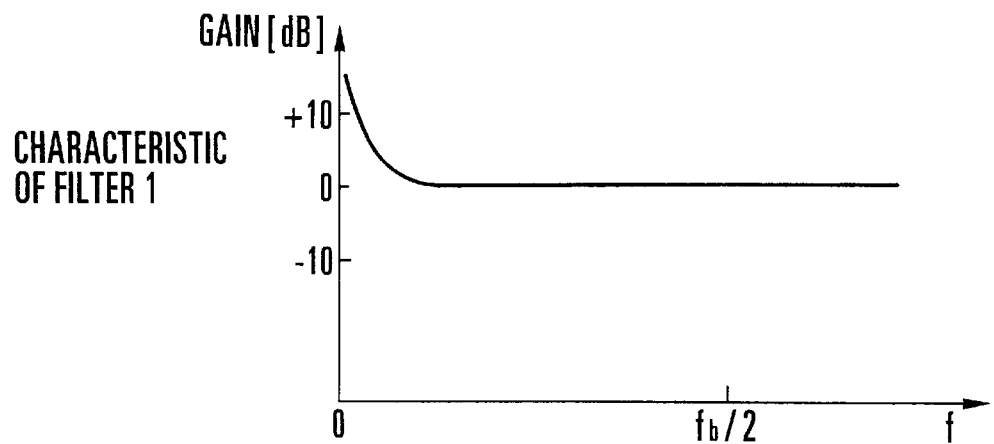
F I G. 19(b)
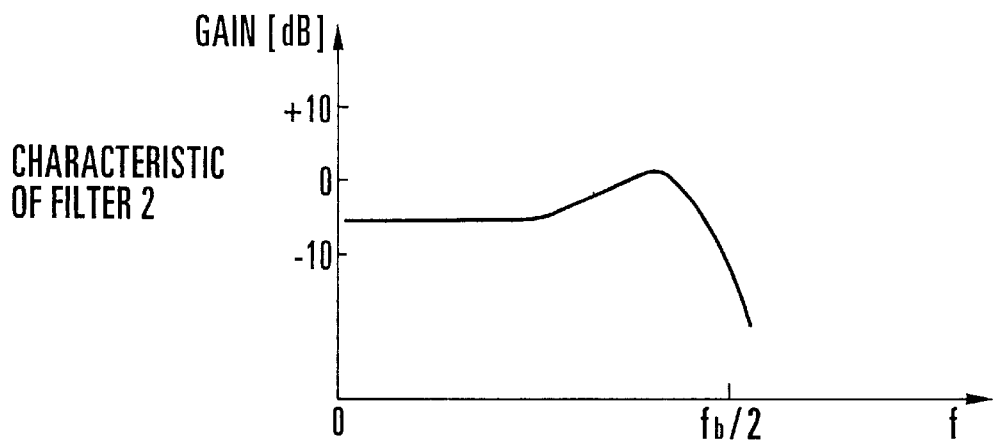
F I G. 19(c)
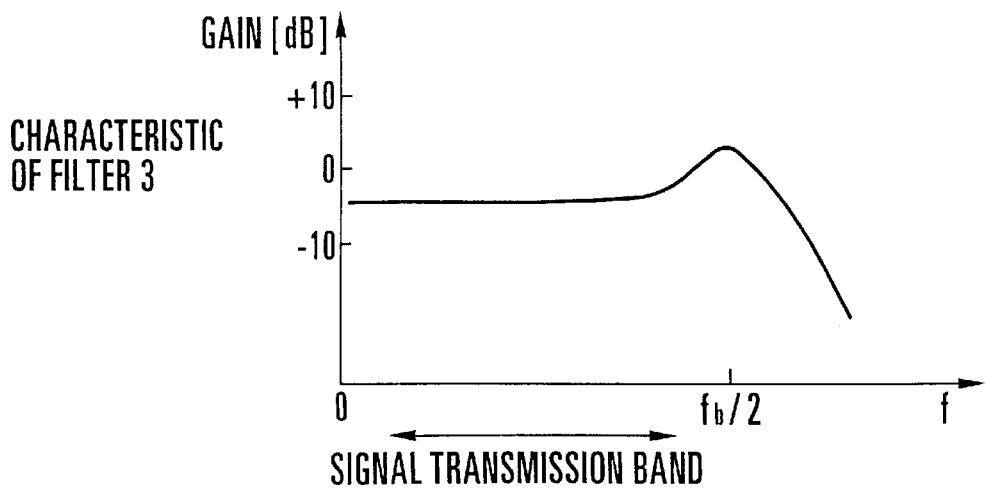

REPRODUCING APPARATUS CAPABLE OF GENERATING CLOCK SIGNAL SYNCHRONIZED IN PHASE WITH REPRODUCED DATA

BACKGROUND OF THE INVENTION

1. Field of the Invention

This invention relates to a reproducing apparatus and more particularly to a reproducing apparatus arranged to be capable of generating a clock signal synchronized in phase with reproduced data.

2. Description of Related Art

The reproducing apparatuses of the above-stated kind include digital VTRs which are arranged to record and reproduce video signals in the form of digital signals on and from magnetic tapes. The digital VTRs are being developed not only for broadcasting stations but also for home use. The home-use digital VTRs obtain video images mainly from TV broadcast. However, other sources of video images have come to be often used, including the analog VTRs of VHS and 8-mm systems, personal computers, TV games, etc.

In extracting a clock signal from a data train being received by an apparatus which transmits data at a high speed, such as a digital VTR, it is known to use a phase-locked loop (hereinafter referred to as PLL) which is arranged as shown in FIG. 1.

Referring to FIG. 1, a phase difference between reproduced data and a clock signal is detected by a phase comparison circuit 701. A low-pass filter (hereinafter referred to as LPF) 702 filters a signal indicative of the phase difference thus obtained by the phase comparison circuit 701, and the filtered signal is supplied to a voltage-controlled oscillator (hereinafter referred to as VCO) 703 as a control signal. The VCO 703 generates a clock signal having a frequency corresponding to the voltage of the control signal. A frequency divider 704 then frequency-divides the clock signal outputted from the VCO 703 and feeds the frequency-divided clock signal back to the phase comparison circuit 701.

However, in all the apparatuses mentioned above, PLL circuits employed for generating a clock signal are configured as analog circuits. The analog circuits are apt to have their characteristics vary with variations of ambient conditions such as temperature, aging, etc., and thus result in an unstable clock signal generating action.

Meanwhile, the digital VTRs are also required, like in the case of analog VTRs, to have special reproducing functions such as fast feeding, slow reproduction, etc. However, in carrying out such a special reproducing function, the relative speed of a head to a tape vary to cause variations in frequency of the reproduced signal. If the frequency of the reproduced signal varies too much, the frequency comes out of the lock range of the PLL, thereby making it impossible to obtain an adequate clock signal.

Further, for obtaining more appropriate data, the digital VTR is provided with an equalizer for equalizing the waveform of the reproduced signal. However, if the equalizing characteristic of the equalizer is fixedly set to obtain an optimum waveform for normal reproduction, the amount of errors in reproduced data increases to deteriorate picture quality in the event of a special reproduction, since the frequency of the reproduced signal varies during the special reproduction, as mentioned above, and the set characteristic is not appropriate for the special reproduction.

Further, the video signals obtained from the video image sources of varied kinds mentioned above sometimes have variations of time base to such a degree that the video signals are hardly considered to be standard signals. However, the frequency variable ranges of crystal oscillators hitherto used for digital VTRs as recording operation clock signal generating circuits have been too narrow for processing the input video signals of varied kinds mentioned above. This problem may be solved by providing an additional VCO for recording. However, the provision of the additional VCO results in an increase in the number of parts and is, therefore, against a desired reduction in cost and size.

SUMMARY OF THE INVENTION

This invention is directed to the solution of the problems of the prior art described above.

It is, therefore, an object of this invention to provide a reproducing apparatus arranged to be capable of generating an operation clock signal which is apposite to any input signal, without increasing the number of parts.

Under this object, a clock signal generating device arranged according to this invention as an embodiment thereof comprises generating means for generating a clock signal, a first loop including phase difference detecting means for detecting a phase difference between the clock signal and input data and a filter for filtering an output of the phase difference detecting means and feeding back the filtered output to the generating means, a second loop including computation means for obtaining a difference between a frequency of the clock signal and a target frequency and accumulation means for accumulating an output of the computation means and feeding back the accumulated output to the generating means, and control means for manually controlling whether or not the first loop is to be operated.

It is another object of this invention to provide a reproducing apparatus arranged to stably generate a clock signal without being affected by variations of temperature, variations caused by aging, etc., and to have an adequate equalizing characteristic.

Under that object, a reproducing apparatus according to this invention as another embodiment thereof comprises generating means for generating a clock signal, frequency detecting means for detecting a difference between a frequency of the clock signal generated by the generating means and a predetermined frequency, equalizing means for equalizing reproduced data, an equalizing characteristic of the equalizing means being controlled according to an output of the frequency detecting means, and phase difference detecting means for detecting a phase difference between the clock signal generated by the generating means and the reproduced data, a clock signal generating operation of the generating means being controlled according to the output of the frequency detecting means and an output of the phase difference detecting means.

These and further objects and features of this invention will become apparent from the following detailed description of embodiments thereof taken in connection with the accompanying drawings.

BRIEF DESCRIPTION OF THE DRAWINGS

FIGS. 4(a) to 4(c) show in a timing chart an operation of the circuit arrangement shown in FIG. 3.

FIGS. 5(a) to 5(d) show in a timing chart another operation of the circuit arrangement shown in FIG. 3.

FIG. 12 also shows the operation of the phase and amplitude detecting circuit shown in FIG. 10.

FIGS. 14(a) and 14(b) show the operation of the circuit shown in FIG. 13.

FIG. 15 shows the arrangement of an integrator included in the circuit shown in FIG. 13.

FIG. 16 shows the arrangement of an equalizer included in the digital VTR shown in FIG. 9.

FIGS. 19(a) to 19(c) show the characteristic of the circuit of FIG. 16.

DETAILED DESCRIPTION OF THE PREFERRED EMBODIMENTS

Preferred embodiments of this invention are described by way of example below with reference to drawings. In these embodiments, this invention is applied to a digital VTR, which is arranged as shown in FIG. 2.

Figure 1:
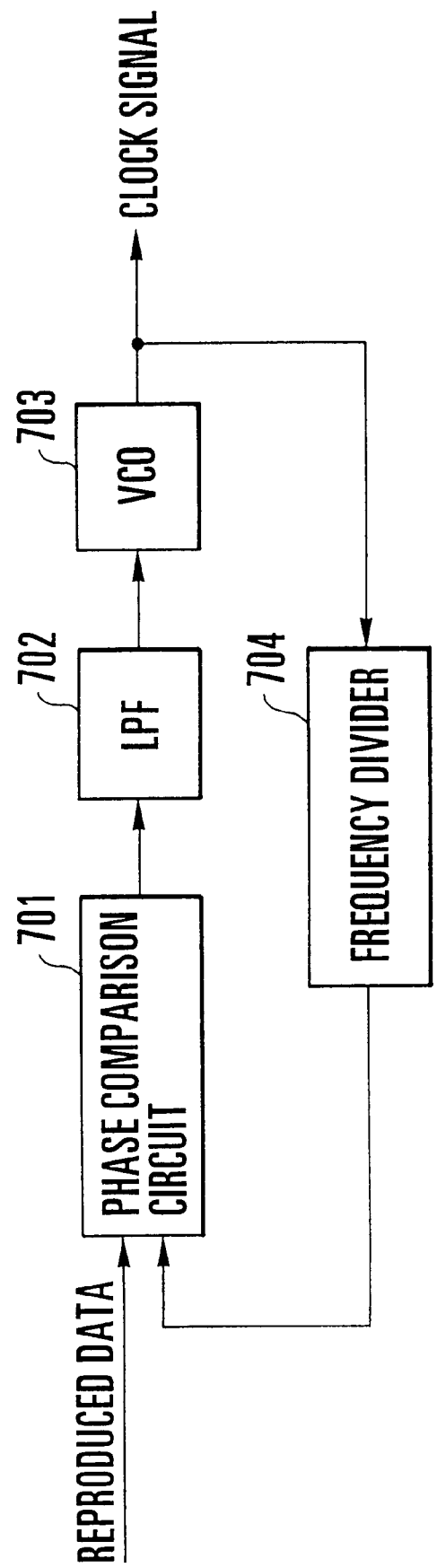
FIG. 1 is a block diagram showing the arrangement of the conventional PLL circuit.
Figure 2:
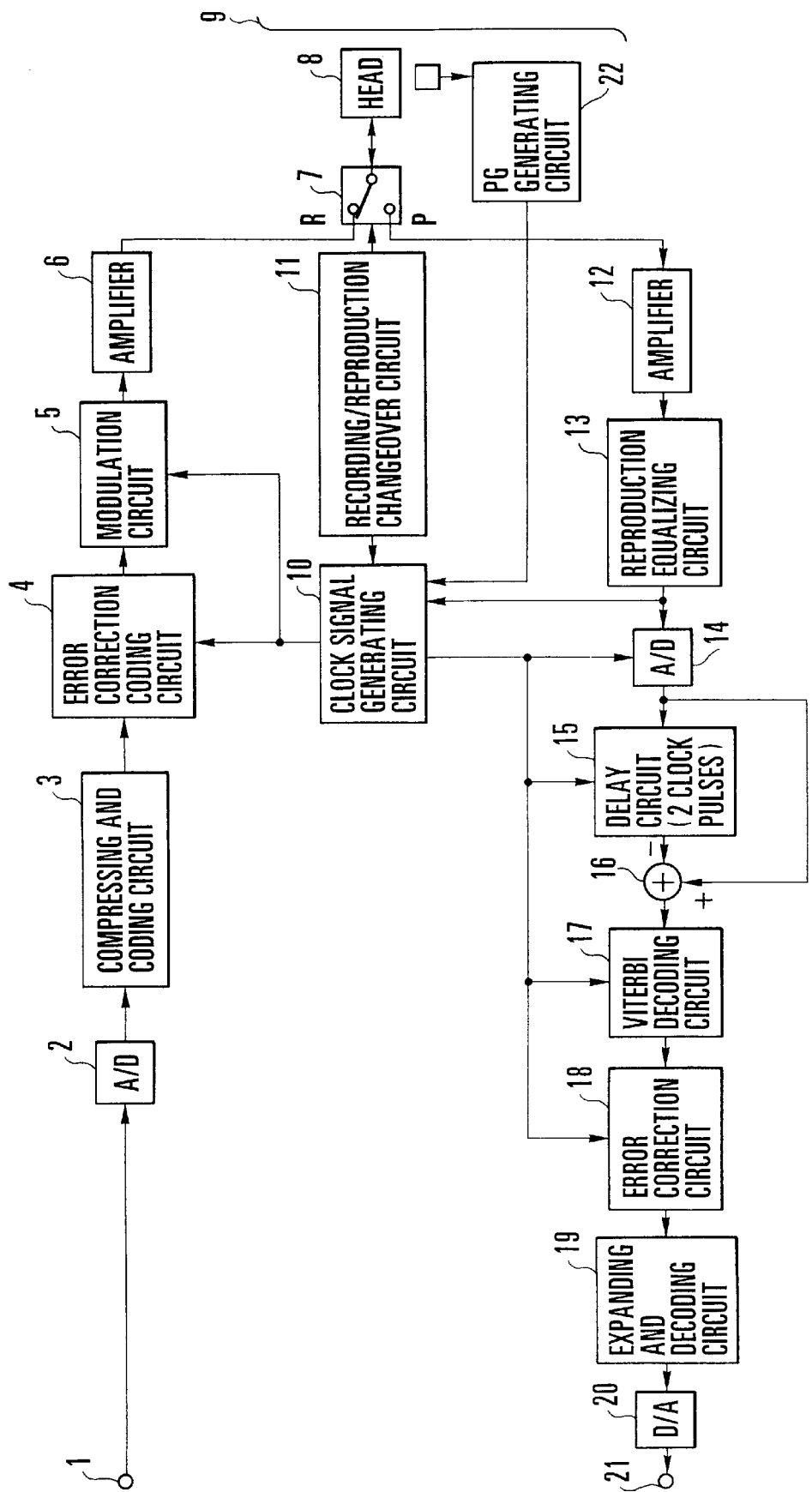
FIG. 2 is a block diagram showing the arrangement of a digital VTR which is an embodiment of this invention.

Referring to FIG. 2, an analog video signal is inputted from an input terminal 1. The analog video signal is converted by an A/D converter 2 into a digital signal. The digital signal is supplied to a compressing and coding circuit 3. The compressing and coding circuit 3 is arranged to block-code every predetermined number of picture elements of the input digital signal by using the known technique such as DCT and quantization. The digital signal or data thus coded is supplied to an error correction coding circuit 4. The error correction coding circuit 4 adds parity data to the coded data and then supplies it to a modulation circuit 5. The modulation circuit 5 performs a digital modulation process on the data received from the error correction coding circuit 4. The modulated data is amplified by an amplifier 6 into recording data. The recording data is supplied via a switch 7 to a magnetic head 8 so as to be recorded on a magnetic tape 9.

A clock signal generating circuit 10 is arranged to generate an operation clock signal for actions to be performed by various parts of the embodiment in a recording or reproducing operation of the embodiment. In the case of this embodiment, the error correction coding circuit 4 and the modulation circuit 5 operate according to the clock signal from the clock signal generating circuit 10.

The operation of a reproducing system of the embodiment is next described as follows.

A digital signal recorded on the magnetic tape 9 is reproduced by the magnetic head 8 and is supplied via the switch 7 to an amplifier 12. In the case of this embodiment, the digital VTR is arranged to record a one-frame amount of video signal in ten tracks on the magnetic tape 9. However, in accordance with this invention, recording may be made in a different manner.

The amplifier 12 amplifies the reproduced signal and then supplies the amplified reproduced signal to a reproduction equalizing circuit 13. The reproduction equalizing circuit 13 performs a so-called integral equalizing action to compensate for variations caused in the characteristic of signals by the magnetic recording and reproducing systems. The equalized reproduced signal is supplied to an A/D converter 14 and the clock signal generating circuit 10. The A/D converter 14 samples the reproduced signal and convert it into a digital signal. Although the reproduced signal is a digital signal, its waveform varies in an analogous manner, which necessitates the reproduced signal to be converted again into a digital signal of "1" and "0" by the A/D converter 14.

The digital signal from the A/D converter 14 is supplied to a delay circuit 15 so as to be delayed as much as two clock pulses. The digital signal thus delayed is supplied to a subtracter 16 so as to have its original signal subtracted therefrom. The integral-equalized waveform of the signal is converted by this process into a waveform having a PR (1, 0, −1) (PR4) characteristic. The signal thus processed is supplied to a Viterbi decoding circuit 17 so as to be subjected to a maximum likelihood decoding process.

The combination of the PR (1, 0, −1) system and the Viterbi decoding process is popularly employed for digital VTRs or the like arranged to perform high density magnetic recording. The use of this combination enables the embodiment to avoid the poor low frequency band characteristic of its magnetic recording system (with respect to the S/N ratio, waveform distortion, etc.) and to minimize transmission error.

The reproduced data is restored by the Viterbi decoding circuit 17 to the state of a data train obtained at the time of recording. The restored reproduced data is supplied to an error correction circuit 18 so as to have any error caused through a transmission route by using parity data added at the time of recording. The corrected data is supplied to an expanding and decoding circuit 19, which expands the amount of information of the reproduced data which was compressed at the time of recording. The data thus expanded is supplied to a D/A converter 20. The D/A converter 20 converts the input digital data into analog data, which is then outputted via an output terminal 21.

In the reproduction system of this embodiment, the A/D converter 14, the delay circuit 15, the Viterbi decoding circuit 17 and the error correction circuit 18 are arranged to operate according to an operation clock signal generated by the clock signal generating circuit 10. Further, a rotation phase signal generating circuit 22 is arranged to generate a rotation phase signal which indicates the rotation phase of the magnetic head 8, and supplies the rotation phase signal to the clock signal generating circuit 10.

The clock signal generating circuit 10 which is included in FIG. 2 is next described as follows.

Figure 3:
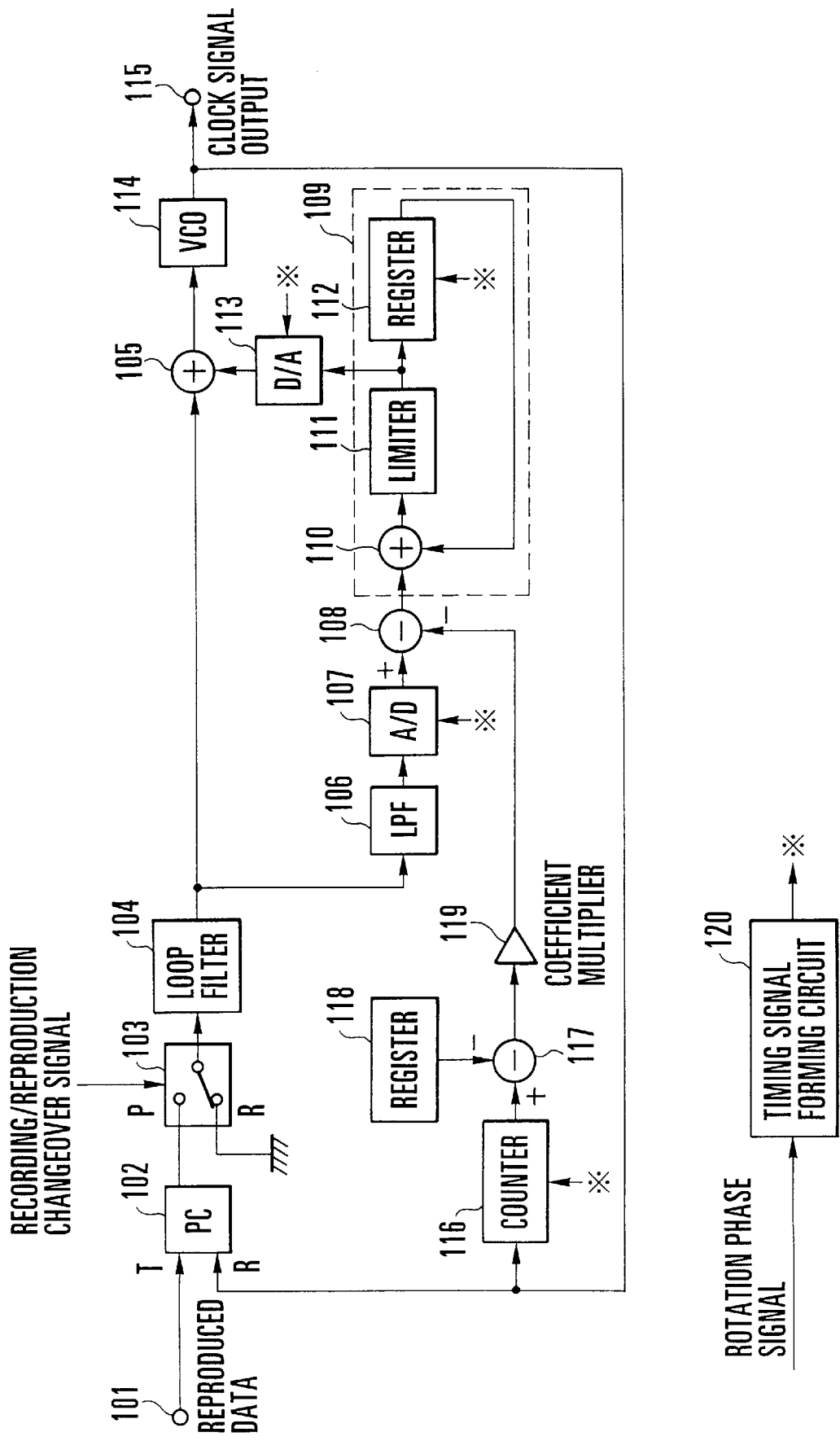
FIG. 3 is a block diagram showing the arrangement of a clock signal generating circuit shown in FIG. 2.

FIG. 3 is a block diagram showing by way of example the arrangement of the clock signal generating circuit 10. Referring to FIG. 3, a phase difference between the reproduced signal (or data) inputted from the input terminal 101 and the output of a VCO 114 is detected by a phase comparator (PC) 102. The result of the phase-difference detection is supplied to a loop filter 104 via a switch 103 so as to be averaged. As a result, a signal having such a voltage as to cancel the phase difference between the reproduced signal and the output of the VCO 114 is supplied to the VCO 114 via an adder 105. The connecting position of the switch 103 is arranged to change according to a recording/reproduction changeover signal coming from a recording/reproduction changeover circuit 11 (FIG. 2). In the case of reproduction, the position of the switch 103 is on the side of a contact P to supply the output of the phase comparator 102 to the loop filter 104. At the time of recording, the position of the switch 103 is on the side of a contact R to supply a signal of 0 V, which indicates no phase difference, to the loop filter 104.

The VCO 114 is arranged to output from an output terminal 115 a signal of a frequency corresponding to an input voltage as a clock signal and also to supply the clock signal to the phase comparator 102. Thus, a PLL loop is constituted by the phase comparator 102—the loop filter 104—the VCO 114.

The output of the VCO 114 which oscillates in the manner mentioned above is supplied also to a counter 116. The counter 116 counts the number of pulses of the output signal of the VCO 114 for a certain period of time which is, for example, required for the magnetic head 8 to trace one track (which period of time is hereinafter expressed as "Ttr" and is set at 1/300 sec in this case). The result of the count is supplied to the positive input terminal of a digital subtracter 117. To the negative input terminal of the subtracter 117 is supplied an output of a register 118.

Assuming that the center frequency of a clock signal taken out from the reproduced digital signal which includes some jitters is expressed as "fcent", a value expressed as "fcent×Ttr" is set at the register 118. This value "fcent×Ttr" corresponds to a number of samples of data to be reproduced within the period of time "Ttr". Therefore, if the VCO 114 is oscillating at the frequency "fcent", the output of the subtracter 117 becomes zero.

The level of the output of the subtracter 117 is adjusted by a coefficient multiplier 119 and is then supplied to the negative input terminal of a digital subtracter 108.

Meanwhile, the output of the loop filter 104 is supplied also to a low-pass filter (LPF) 106 as well as to the above-stated adder 105. The output of the LPF 106 is supplied to an A/D converter 107 so as to be converted into a digital signal at the timing of the period Ttr. A timing signal for the period Ttr is formed by a timing signal forming circuit 120 on the basis of a rotation phase signal generated by the above-stated rotation phase signal generating circuit 22. The rotation phase signal is supplied to the counter 116, the A/D converter 107, a register 112 and a D/A converter 113.

The LPF 106 serves as a prefilter for A/D conversion. The output of the A/D converter 107 is supplied to the positive input terminal of the subtracter 108. The subtracter 108 subtracts the output of the coefficient multiplier 119 from the output of the A/D converter 107 and supplies the result of subtraction to an integrator 109, which is composed of an adder 110, a limiter 111 and the register 112. The integrator 109 is arranged such that the value inputted from the subtracter 108 is accumulated every time the clock signal is inputted to the register 112 as long as the sum obtained by the adder 110 does not reach upper and lower limit values.

The output of the integrator 109 is supplied to the D/A converter 113 so as to be converted into an analog signal. The analog signal is supplied to the adder 105.

The clock signal forming operation of the embodiment is next described below.

At the time of reproduction, the switch 103 is on the side of its contact P. Therefore, the output of the phase comparison circuit 102 indicating a phase difference between a reproduced signal and the output of the VCO 114 is supplied to the loop filter 104 via the switch 103. The output of the phase comparison circuit 102 is averaged by the loop filter 104 and is supplied to the VCO 114 via the adder 105, in the manner called PLL. The oscillation output of the VCO 114 is outputted as a clock signal from the output terminal 115.

In a case where some external factor is causing the oscillation frequency of the VCO 114 to drop while a state of phase lock is obtained by the PLL composed of the phase comparison circuit 102, the loop filter 104 and the VCO 114, the embodiment operates as follows. In this case, a phase difference appears between the input signals of the phase comparison circuit 102. Therefore, the output voltage of the phase comparison circuit 102 becomes lower, and the output voltage of the loop filter 104 rises. Then, the clock signal output of the VCO 114 and the clock signal in the reproduced signal are controlled to be in phase.

Although the phase difference of the oscillation frequency of the VCO 114 from the phase of the reproduced clock signal due to an error of the oscillation frequency of the VCO 114 can be corrected in this manner, the output voltage of the loop filter 104 has already become higher to deviate from a center of the lock range of the PLL. Under such a condition, a further operation of correcting a difference from the phase of the reproduced clock signal tends to cancel the locked state of the PLL when the phase varies.

In view of this problem, this embodiment is arranged as follows. A path composed of the LPF 106—the A/D converter 107—the integrator 109—the D/A converter 113—the adder 105 is arranged to detect a phase error at a time constant which is slower than that of the PLL and permits detection of a trend of the output of the loop filter 104. The trend thus detected is added to the output of the loop filter 104 in such a way as to absorb the deviation of the output of the loop filter 104 by the output of the D/A converter 113, so that the output of the loop filter 104 can be always kept at the center of the lock range of the PLL. This action is described in further detail as follows.

The A/D converter 107 operates at the timing of the period "Ttr", i.e., at 300 Hz, as mentioned in the foregoing. The cutoff frequency of the LPF 106 is, therefore, 150 Hz and thus has a very slow response speed. Therefore, when the output voltage of the loop filter 104 is caused to rise by a phase difference from the reproduced signal as mentioned above, the output of the LPF 106 also varies slowly to cause the output of the A/D converter 107 to rise.

Then, the value of the register 112 within the integrator 109 varies in the positive direction. As a result, the output of the D/A converter 113 increases. Since the output of the D/A converter 113 is equal to an error signal outputted during the period "Ttr" from the loop filter 104, the error signal outputted from the loop filter 104 can be absorbed by the D/A converter 113.

In other words, what is to be controlled by raising the output of the loop filter 104 is controlled by the output of the D/A converter 113, so that the output of the loop filter 104 can be kept at the center of the lock range of the PLL.

When the output of the adder 105 increases, the oscillation frequency of the VCO 114 becomes higher, and the value of the register 112 ceases to vary, at a point where the clock signal from the VCO 114 is phase-locked to the reproduced signal. During this phase-locked period, the oscillation frequency of the VCO 114 remains unchanged, so that no error signal is outputted from the subtracter 117. The output of the A/D converter 107 is then outputted from the subtracter 108 as it is.

Frequency control to be performed by the counter 116 and the register 118 is next described as follows.

As mentioned in the foregoing, the counter 116 counts the clock signal outputted from the VCO 114 during the period "Ttr". The counter 116 supplies a count value to the subtracter 117 at the timing when the timing signal "Ttr" is inputted. Then, the subtracter 117 subtracts the output of the register 118 from the count value. This operation is shown in a timing chart in FIGS. 4(a), 4(b) and 4(c).

As shown in FIG. 4(b), the timing signal forming circuit 120 generates a timing signal. According to this timing signal, the output of the counter 116 is supplied to the subtracter 117. FIGS. 4(c) shows the output of the counter 116. In a case where the frequency of the clock signal is equal to a desired frequency, the count value which is outputted according to the timing signal is at 100% of the above-stated value "fcent×Ttr".

The output of the subtracter 117 is averaged by the integrator 109 through the coefficient multiplier 119 and the subtracter 108. The averaged output is supplied to the VCO 114 through the adder 105 in a feedback loop. Automatic control over the oscillation frequency of the VCO 114, called AFC, is thus carried out by this feedback loop.

Further, the center frequency of the VCO 114 is variable by varying the value of the register 118.

The gain of the coefficient multiplier 119 is set in such a way as to equalize gains of the parts from the output of the loop filter 104 through the input of the subtracter 108. More specifically, the gain of the coefficient multiplier 119 is set to make the gain of the route (path) of the loop filter 104—the LPF 106—the A/D converter 107—the subtracter 108 equal to that of another route of the loop filter 104—the adder 105—the VCO 114—the counter 116—the subtracter 117—the coefficient multiplier 119—the subtracter 108. This arrangement effectively prevents any disturbance from being added from the integrator 109 to the transient response of the PLL beginning with the phase comparison circuit 102 and ending also at the phase comparison circuit 102 through the loop filter 104 and the VCO 114.

The operation of the embodiment to be performed in recording is next described as follows.

In the case of the embodiment, during recording, a signal of 0 V is supplied to the loop filter 104 with the position of the switch 103 shifted to the contact R, as mentioned above. In other words, in the case of recording, only the loop of AFC (automatic frequency control) is rendered operative while the loop for phase control is not activated.

Under this condition, when an input video signal having each vertical period longer than a signal shown in FIG. 4(a) is inputted, the rotational frequency of a rotary drum (the magnetic head) is lowered accordingly to record the input video signal. Therefore, when a signal having each vertical period longer by 10% is inputted as shown in FIG. 5(a), one cycle of the timing signal from the timing signal forming circuit 120 becomes longer by 10% as shown in FIG. 5(b).

The counter 116 counts the clock signal from the VCO 114 until it is reset by the timing signal. Therefore, in this instance, the count value obtained immediately before resetting becomes larger by 10% than the count value shown in FIG. 4(c). Then, when the output of the register 118 is subtracted from the output of the counter 116, the resultant number of waves of the clock signal is greater by 10% (a higher frequency).

Then, as mentioned in the foregoing, the output of the subtracter 117 is fed back to the VCO 114 through the coefficient multiplier 119, the subtracter 108, the integrator 109 and the adder 105. Since the coefficient multiplier 119 outputs a positive value, the subtracter 108 outputs a negative value. Therefore, the output of the integrator 109 gradually decreases. As a result, the oscillation frequency of the VCO 114 also decreases accordingly.

Then, when the number of output pulses per period of the VCO 114 becomes the same as shown in FIG. 4(c), the count value of the counter 116 and the output value of the register 118 come to coincide with each other to make the output of the subtracter 117 zero. Therefore, the output of the integrator 109 ceases to vary and the VCO 114 goes on to output its clock signal at that frequency.

Since no reproduced data is obtained at the time of recording, the switch 103 is controlled to prevent the whole circuit arrangement from being affected by any erroneous action that results from an output of the phase comparison circuit 102. In recording, the PLL loop is thus not rendered operative, and the clock signal is generated by operating the AFC loop alone.

In a case where a video signal which has a long vertical period as shown in FIG. 5(a) is to be recorded without changing the rotational frequency of the head, for example, by time-base-compressing a video signal for the period "1.1 Ttr" to a video signal for the period "Ttr", the content of the register 118 may be rewritten according to the frequency of the input video signal. Specifically, in the embodiment, a value which is larger by 10% than the value shown in FIG. 4(c) is written into the register 118.

Then, since the counter 116 is reset by the timing of the period "Ttr", the output of the subtracter 117 is obtained by a number of clock pulses which is less by 10% than a normal number (to have a lower frequency).

In other words, since the subtracter 117 comes to output a negative value, the output of the subtracter 108 becomes a positive value to cause the output of the integrator 109 to gradually increase. Therefore, the oscillation frequency of the VCO 114 rises, and the output of the integrator 109 ceases to vary, at a point where the oscillation frequency of the VCO 114 comes to coincide with the frequency of the input video signal.

At the time of reproduction, the embodiment is capable of stably generating a clock signal by performing phase control and frequency control over the clock signal. In recording, the embodiment is capable of generating the clock signal in a manner most apposite to an input video signal by using only the frequency control loop without operating the phase control loop.

In other words, the embodiment is arranged to be capable of keeping the number of clock pulses generated per track constant irrespective of the frequency of the input video signal and also to be capable of generating the clock signal at the same frequency as the frequency of the input video signal. Therefore, even in cases where video signals of varied kinds and states are to be recorded, all of them can be adequately recorded.

Further, the arrangement of using one and the same clock signal generating circuit both for reproduction and for recording enables the embodiment to easily generate clock signals for reproduction and for recording without having recourse to any additional frequency control circuit for generation of a clock signal for recording.

In the embodiment described above, a clock signal is obtained by carrying out normal phase control with the PLL composed of the phase comparison circuit 102—the loop filter 104—the adder 105—the VCO 114. The trend of the output of the loop filter 104 is detected by operating the feedback loop composed of the LPF 106—the A/D converter 107—the integrator 109—the D/A converter 113—the adder 105—the VCO 114 for every clock signal period "Ttr". Any deviation of the output voltage of the loop filter 104 (the input voltage of the VCO 114) caused by a phase error taking place during the period "Ttr" is compensated for, so that the output of the PLL can be kept at the center of the lock range of the PLL. Therefore, the PLL can be prevented from readily unlocking for changes taking place in the oscillation frequency of the VCO 114.

Further, an error of the oscillation frequency of the VCO 114 taking place during the period "Ttr" is detected by counting the output of the VCO 114 with the counter 116 and subtracting the output of the register 118 from the count value of the counter 116. Then, an average value of the frequency error is obtained by subtracting the thus-detected error from the output of the loop filter 104 and integrating the result of the subtraction. Then, the oscillation frequency of the VCO 114 is controlled on the basis of the averaged value of the frequency error. The oscillation frequency of the VCO 114 is thus effectively prevented from being varied by variations of temperature or by variations resulting from aging.

In the case of the embodiment described above, the trend of the output of the loop filter 104 is detected by averaging the output of the loop filter 104 through the LPF 106 and integrating the output of the LPF 106. However, this invention is not limited to this method, which may be replaced with some other detecting methods, such as a method of counting the MSB of the data outputted from the A/D converter 107 by means of an up-down counter.

While the embodiment described above is arranged to form a reproducing operation clock signal on the basis of a reproduced signal obtained immediately before the A/D converter 14, this arrangement of course may be changed to generate the operation clock signal by using reproduced data obtained by the A/D converter 14.

Figure 6:
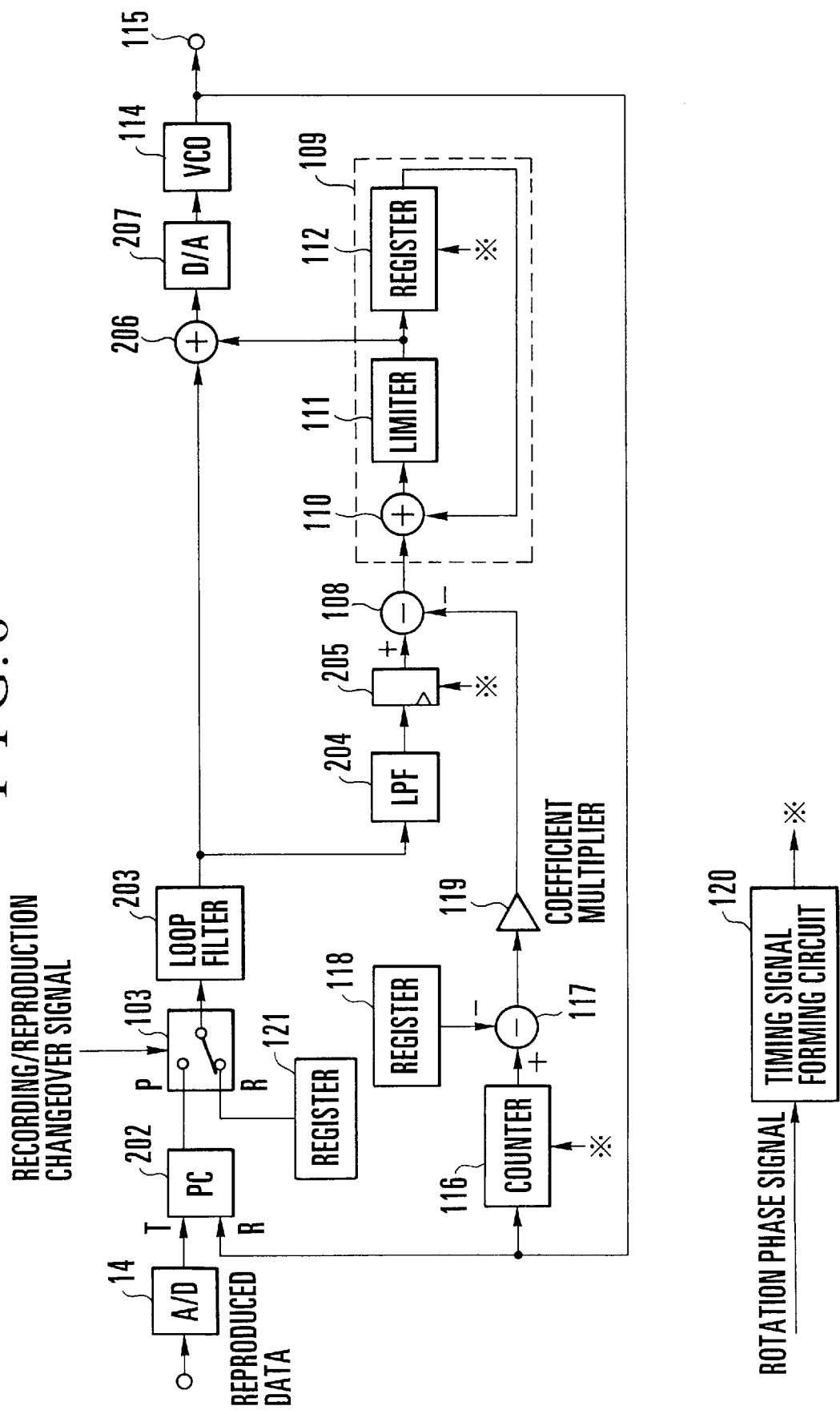
FIG. 6 is a block diagram showing another example of the arrangement of the clock signal generating circuit shown in FIG. 2.

FIG. 6 is a block diagram showing the arrangement of a clock signal generating circuit which is arranged as a second embodiment of this invention. In this case, the clock signal generating circuit is arranged to generate a clock signal from reproduced data obtained by the A/D converter 14. All the parts of this embodiment that are the same as those of the first embodiment described above are indicated by the same reference numerals in FIG. 6.

In the case of the second embodiment, reproduced data which has been obtained by A/D-converting a reproduced signal by the A/D converter 14 is supplied to a digital phase comparison circuit 202. The phase comparison circuit 202 is arranged to output a multibit digital signal according to a phase difference between the reproduced data and the output of the VCO 114. The multibit digital signal is then supplied to a loop filter 203.

The loop filter 203 acts in the same manner as the loop filter 104 of FIG. 3 though it is a digital filter while the latter is an analog filter. The output of the loop filter 203 is supplied to a digital adder 206 and an LPF 204.

The output of the adder 206 is converted into an analog signal by a D/A converter 207. The analog signal is supplied to the VCO 114. In the case of the second embodiment, the clock signal outputted from the output terminal 115 is used for the operation of the A/D converter 14 and that of the D/A converter 207.

Further, in FIG. 6, a register 121 is provided to be connected to the terminal R of the switch 103, so that, during recording, with the position of the switch 103 changed over to the terminal R, digital data indicative of the absence of any phase difference is supplied to the loop filter 203.

The LPF 204 is arranged to average an amount of data outputted from the loop filter 203 for one track and to supply the averaged data to a register 205.

The register 205 is arranged to take in the output of the LPF 204 at the timing of the period "Ttr", i.e., at the end of a track, as shown in FIG. 4(b). The output of the register 205 is supplied to the positive input terminal of the subtracter 108.

The counter 116 is arranged to count the output of the VCO 114 in the same manner as in the first embodiment described in the foregoing. The output of the register 118 is subtracted from the count value by the subtracter 117. The output of the subtracter 117 is supplied via the coefficient multiplier 119 to the negative input terminal of the subtracter 108. After that, the operation of the second embodiment is the same as that of the first embodiment.

As described above, in the second embodiment, almost all the circuits can be digitized by digitizing the phase comparison circuit and the loop filter. The stability of operation against aging deterioration and ease of maintenance of the apparatus can be enhanced by the digitizing arrangement.

A third embodiment of this invention wherein a clock signal generated by the period "Ttr" is controlled by a programmed processes of a microcomputer is next described as follows.

Figure 7:
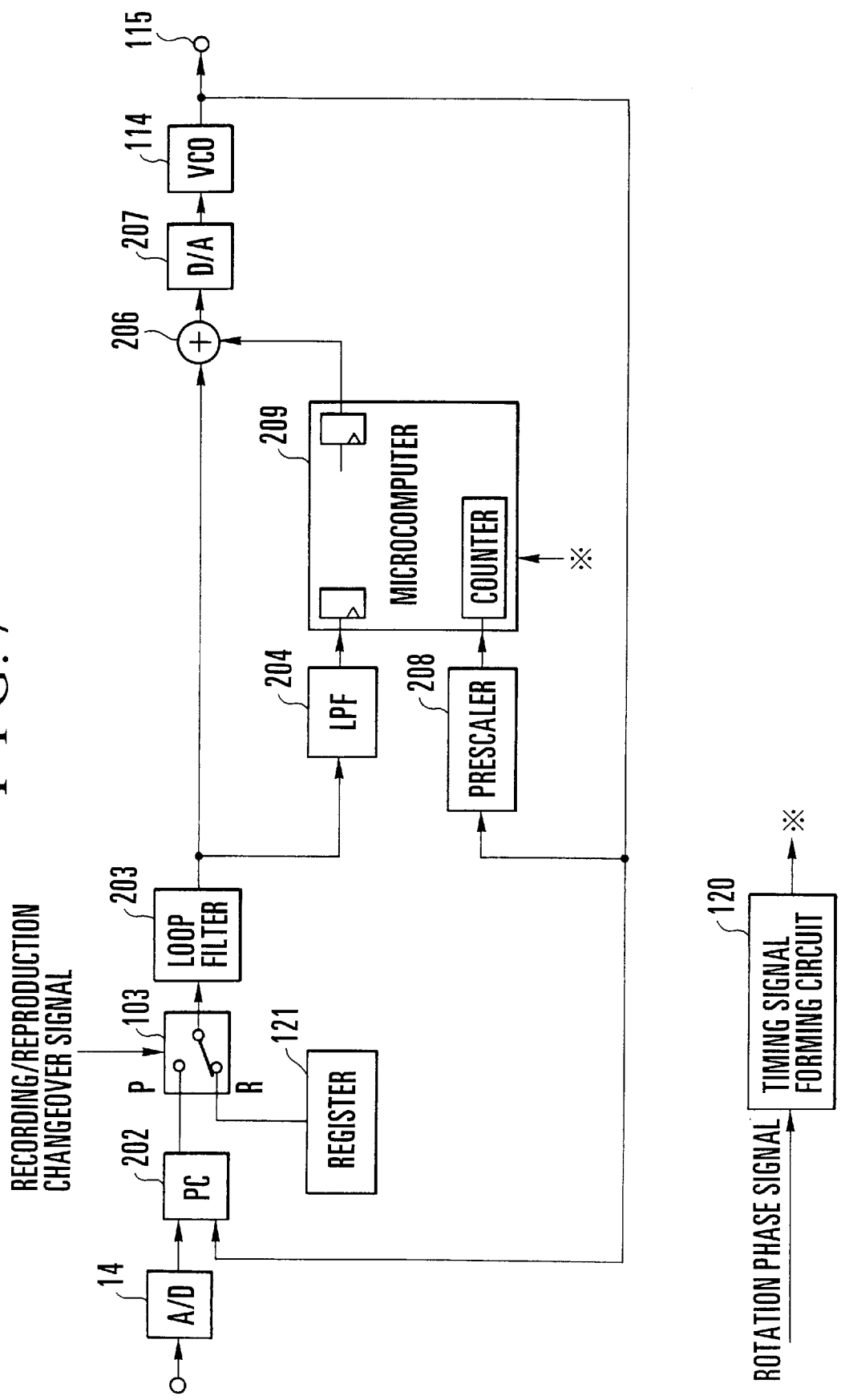
FIG. 7 is a block diagram showing a further example of the arrangement of the clock signal generating circuit shown in FIG. 2.

FIG. 7 is a block diagram showing a clock signal generating circuit which is arranged as the third embodiment of this invention. All the parts of the third embodiment arranged in the same manner as those of the second embodiment are indicated by the same reference numerals in FIG. 7.

Referring to FIG. 7, the output of the LPF 204 is supplied to an input port of a microcomputer 209. The output of the VCO 114 is frequency-divided by a prescaler 208 and is then supplied to a counter which is disposed within a microcomputer 209. Although the counter may be arranged outside of the microcomputer 208, the number of parts can be lessened by the use of a built-in counter.

Figure 8:
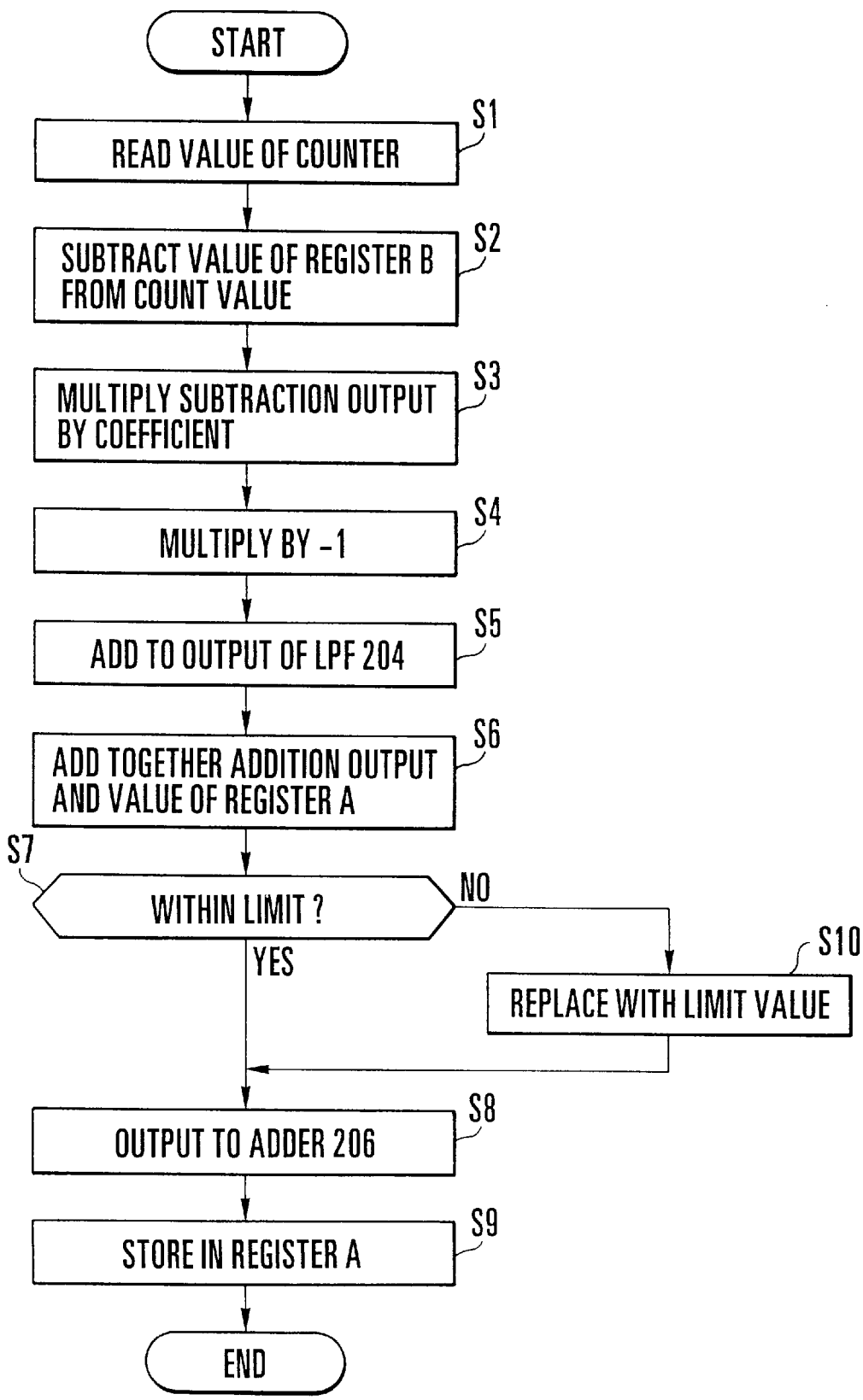
FIG. 8 is a flow chart showing an operation of a microcomputer included in the arrangement of FIG. 7.

FIG. 8 is a flow chart showing an operation of the microcomputer 209. In FIG. 8, registers B and A are respectively arranged to act similarly to the registers 118 and 112 of FIG. 6.

A signal indicating the period "Ttr" is inputted to the microcomputer 209 from the timing signal forming circuit 120 to cause the microcomputer 209 to start.

At a step S1, upon receipt of the signal which indicates the period "Ttr", the microcomputer 209 first reads the value of the counter. At a step S2, the value of the register B is subtracted from the count value. At a step S3, the result of subtraction is multiplied by a coefficient which corresponds to the coefficient multiplier 119 of FIG. 6. At a step S4, a value thus obtained is further multiplied by −1. At a step S5, the output of the loop filter 203 which has been outputted from the LPF 204 at the timing of the period "Ttr" is added to the value obtained at the step S4.

At a step S6, the value obtained at the step S5 and the value of the register A are added together. At steps S7 and S10, if the value obtained at the step S6 is found to exceed a limit, the value is replaced with a limit value. The limit value is stored in the register A and is also outputted. If not, the value is stored in the register A and also outputted at steps S8 and S9.

In the case of the third embodiment, a deviation of the output voltage of the loop filter 203 due to a phase error taking place during the period "Ttr" and changes in frequency are compensated for by the microcomputer 209, so that the number of necessary parts can be further lessened.

Further, the action of compensating for the deviation of the voltage input to the VCO 114 due to a phase error taking place during the period "Ttr" is carried out at a speed of 300 Hz which is a slow speed. This action is, therefore, arranged to be carried out at a spare moment at which no other action of the microcomputer 209 is necessary, so that the action can be adequately carried out without increasing the number of parts.

Further, in the third embodiment, control over the action of the phase control loop is arranged to be accomplished by providing the switch 103 at the output of the phase comparison circuit 202. However, the same advantageous effect can be attained either by arranging the switch at some other part of the phase control loop or by arranging the digital circuit to be logically brought to a stop.

As apparent from the description given above, the operation clock signal is controlled through a loop of controlling the frequency of the output clock signal and another loop of controlling its phase. In addition to these control actions, control is made to decide whether or not the phase control loop is to be used. Therefore, the clock signal can be generated in an optimum manner for each of cases where both the phase and frequency controlling actions are necessary and where only the frequency controlling action is necessary.

Further, since the clock signal can be generated by a common circuit for the different control purposes, it is not necessary to separately arranging different circuits for these purposes.

Figure 9:
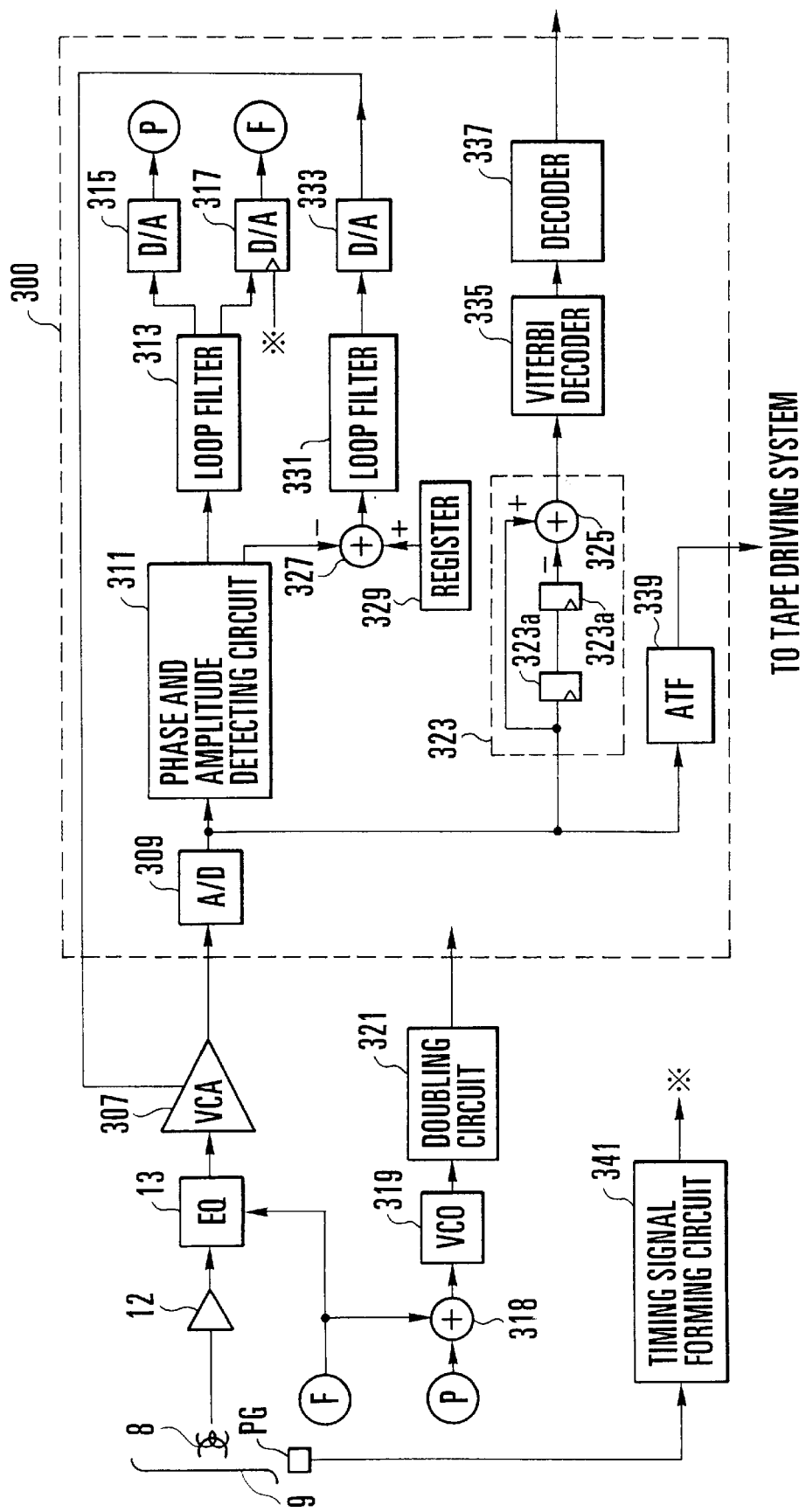
FIG. 9 is a block diagram showing the arrangement of a digital VTR as another embodiment of this invention.

A fourth embodiment of this invention is next described as follows. FIG. 9 is a block diagram showing the arrangement of a reproduction system for reproducing a digital signal recorded by the recording system of the apparatus shown in FIG. 2. In FIG. 9, all parts that are arranged similarly to those of FIG. 2 are indicated by the same reference numerals.

Referring to FIG. 9, a signal reproduced by a magnetic head 8 from a magnetic tape 9 is amplified by a head amplifier 12. The amplified reproduced signal is supplied to an equalizer 13.

In the case of the digital VTR which is the fourth embodiment of this invention, a one-frame amount of video signal is recorded in ten helical tracks formed on the magnetic tape 9, like in the case of the embodiments described in the foregoing. However, signals which can be processed in this embodiment are of course not limited to signals recorded in that manner.

The equalizer 13 performs an integral equalizing process on the reproduced signal. The reproduced signal equalized is then supplied to a VCA (variable control amplifier) 307 to be amplified there. The gain of the VCA 307 is controllable and is controlled by a control signal coming from a D/A converter 333, which will be described later.

An adder 318 adds up control signals coming from D/A converters 315 and 317 into a control signal. The control signal is supplied to a VCO 319.

The VCO 319 generates a clock signal of a frequency corresponding to the voltage of the control signal from the adder 318. The clock signal is supplied to a doubling circuit 321. At the doubling circuit 321, the frequency of the clock signal from the VCO 319 is stepped up to a frequency which is twice as high as the original frequency.

In FIG. 9, a part 300 encompassed with a broken line is composed of digital circuits. All elements except the D/A converter 317 within the part 300 are arranged to operate according to the control signal coming from the doubling circuit 321. Other parts of the system are analog circuits which are formed on one and the same integrated circuit. The digital circuits within the part 300 encompassed with the broken line operate as follows.

The reproduced signal the amplitude of which is controlled by the VCA 307 as mentioned above is supplied to and sampled and converted into a digital signal by an A/D converter 309. The digital signal consists of a plurality of bits per sample (5 bits in this case).

The signal recorded on the tape 9 is of course a digital signal. However, the reproduced signal is in an analog waveform. Therefore, in this case, the reproduced signal having the analog waveform is A/D-converted back to a signal of a digital waveform.

The reproduced signal outputted from the A/D converter 309, i.e., digital data, is supplied to a phase and amplitude detecting circuit 311, a PR4 equalizer 323 and an ATF circuit 339.

Within the PR4 equalizer 323, a subtracter 325 is arranged to perform a subtraction process on the data outputted from the A/D converter 309 with data which has been obtained two clock pulses before and delayed by a latch 323a. The subtraction process is performed in such a way as to impart a PR4 (partial response class 4) characteristic. The data thus processed is supplied to a Viterbi decoder 335. Thus, the PR4 equalizer 323 functions similarly to the delay circuit 15 and the subtracter 16 of FIG. 2. The Viterbi decoder 335 is arranged to detect data of one bit per sample from the reproduced data on the basis of the likelihood of input three-valued data in accordance with a known Viterbi detection method. The data thus detected is supplied to a decoder 337. The decoder 337 is arranged to decode the reproduced data coming from the Viterbi decoder 335 and to convert it into the video signal of the original form by expanding the information amount of the data. The decoder 337 functions similarly to the error correction circuit 18 and the expanding and decoding circuit 19 of FIG. 2.

The ATF circuit 339 extracts a pilot signal component from the reproduced data coming from the A/D converter 309. The ATF circuit 339 then forms an error signal indicating a tracking deviation of the head 8 from each helical track of the tape 9 on the basis of the pilot signal component extracted. The error signal is used for controlling a tape driving system which performs a transporting action on the tape 9 in such a way as to correct the tracking deviation. The ATF circuit 339 can be arranged according to what is disclosed in Japanese Patent Application No. HEI 6-277832 (U.S. patent application Ser. No. 08/551,336).

The phase and amplitude detecting circuit 311 is arranged to detect a phase difference between the reproduced signal from the equalizer 13 and the clock signal from the doubling circuit 321 and also to detect the amplitude of a signal outputted from the VCA 307 at a sampling point of the A/D converter 309 (at the timing of the clock signal outputted from the doubling circuit 321). The phase and amplitude detecting circuit 311 supplies the result of phase detection to a loop filter 313 and the result of amplitude detection to a subtracter 327.

The details of the phase and amplitude detecting circuit 311 are described as follows.

Figure 10:
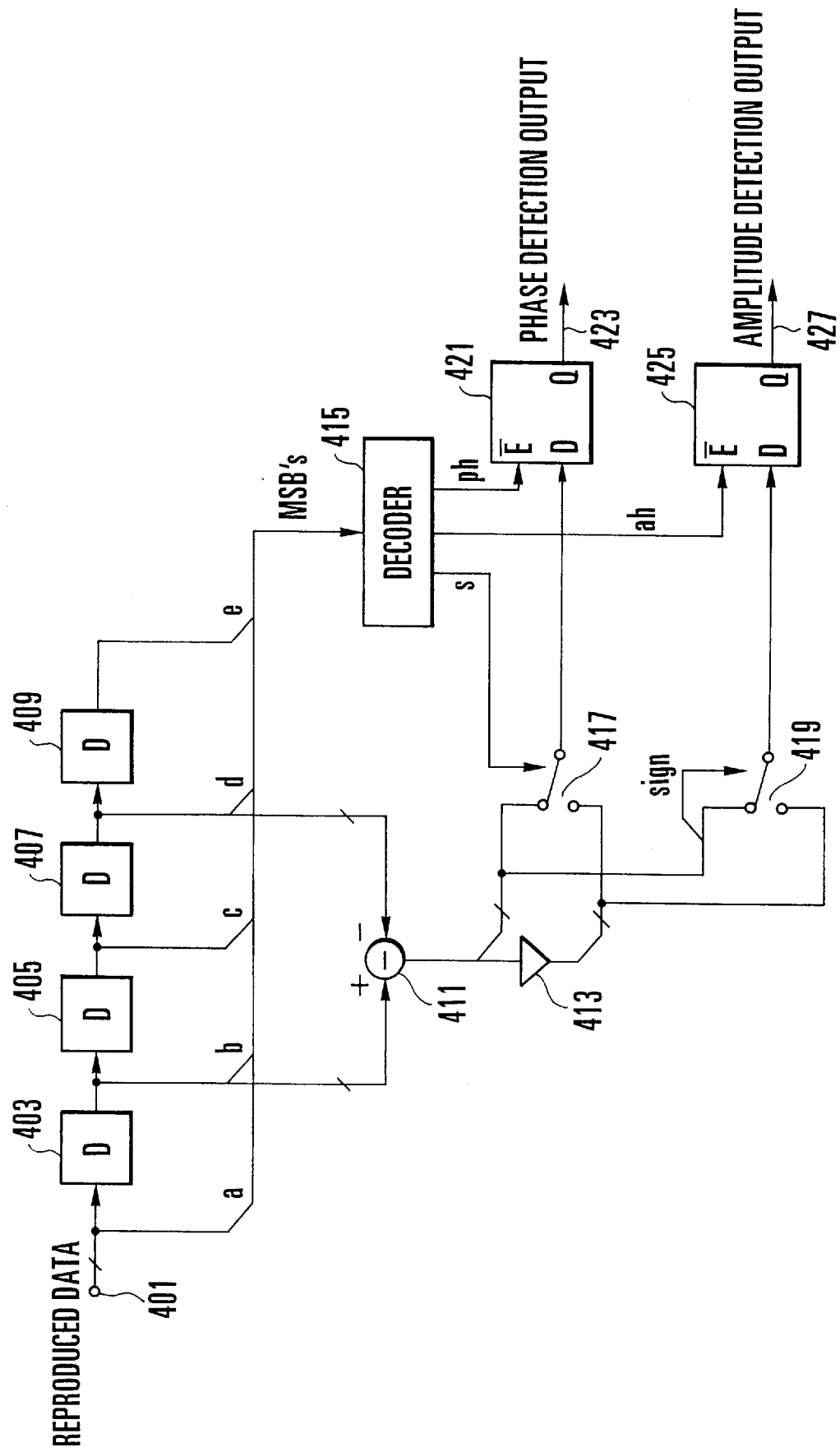
FIG. 10 is a block diagram showing the arrangement of a phase and amplitude detecting circuit shown in FIG. 9.

FIG. 10 is a block diagram showing the arrangement of the phase and amplitude detecting circuit 311. Referring to FIG. 10, delay circuits 403, 405, 407 and 409 are arranged to delay the digital signal coming from the A/D converter 309 in sequence for every clock pulse. A decoder 415 is composed of a logic operation circuit which is arranged to detect a specific pattern from the data coming from an input terminal 401 and the outputs of the delay circuits 403, 405, 407 and 409.

A sign inverting circuit 413 is arranged to invert the output of a subtracter 411. Switches 417 and 419 are arranged respectively to output the input and the output of the sign inverting circuit 413 by switching them one over to the other. A latch circuit 421 is arranged to sample and hold the output of the switch 417 according to a signal "ph" coming from the decoder 415 and to output the resultant signal as a phase detection output. A latch circuit 425 is arranged to sample and hold the output of the switch 419 according to a signal "ah" from the decoder 415 and to output the resultant signal as an amplitude detection output.

With the phase and amplitude detecting circuit 311 arranged in this manner, the A/D-converted reproduced signal (data) is inputted to the input terminal 401. The reproduced signal is delayed by the delay circuits 403, 405, 407 and 409 one after another. The outputs of the delay circuits 403 and 407 are supplied to the subtracter 411. The subtracter 411 then outputs a PR4 signal.

Assume here that the MSB of the input data and those of the 5-bit output data of the delay circuits 403, 405, 407 and 409 are expressed respectively as a, b, c, d and e. Further, the A/D conversion process on the reproduced signal is arranged to have the average value of the reproduced signal come to the center of the range of A/D conversion, so that the data a, b, c, d and e become binary data after the reproduced data is subjected to integral equalization. This data train is supplied to the decoder 415. The decoder 415 then obtains signals "s", "ph" and "ah" by detecting a specific pattern through a logical operation carried out as will be described later herein.

The signal "s" is used to control the switch 417 to cause the switch 417 to selectively output the output of the subtracter 411 or a signal obtained by inverting the sign of the output of the subtracter 411 through the sign inverting circuit 413. The signal "ph" is supplied to a terminal $\overline{\text{E}}$ of the latch circuit 421 so as to sample and hold the output of the switch 417 at the timing of the signal "ph" by controlling the latch circuit 421.

The phase detecting action to be performed by using the signals "s" and "ph" is first described as follows.

Figure 11:
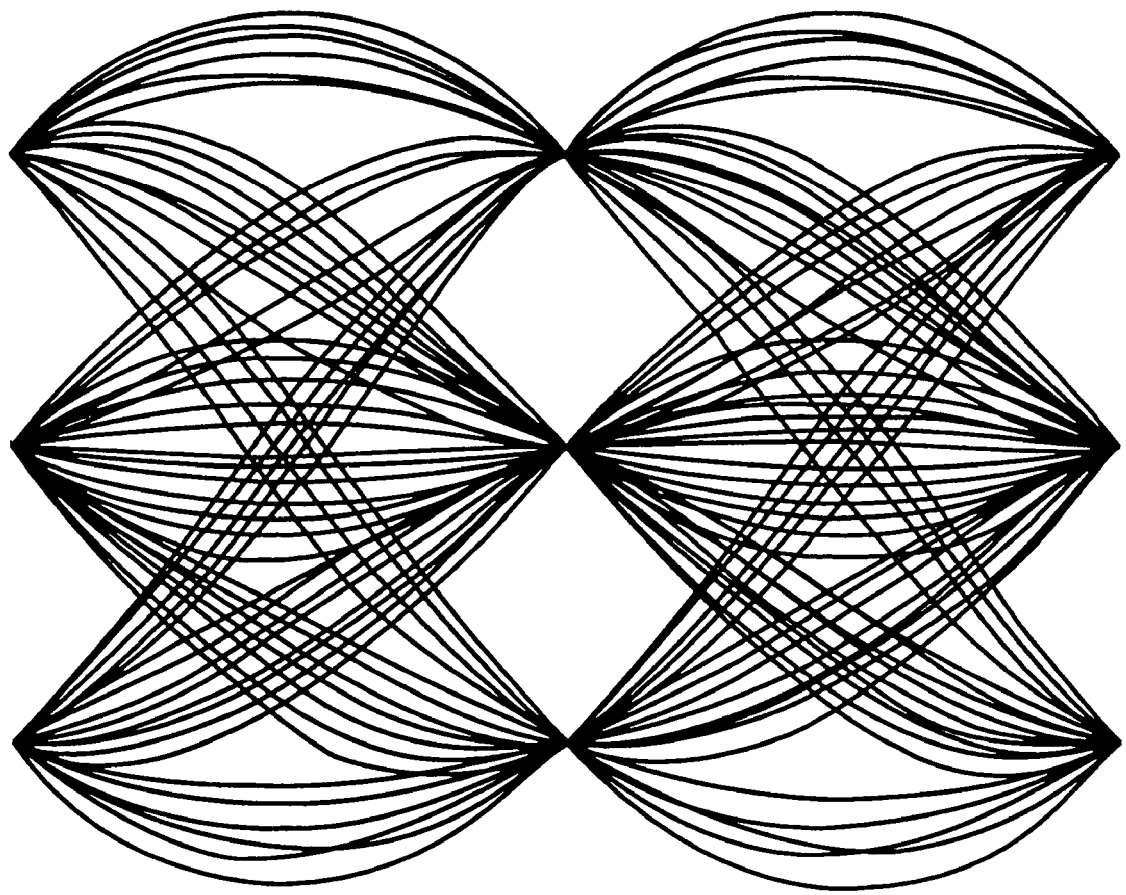
FIG. 11 shows an eye pattern of a signal which has been subjected to the PR4 equalizing process.

FIG. 11 shows an eye pattern of a signal which has been subjected to the PR4 equalizing process. The eye pattern shows a ternary value at the point of data detection. The zero-crossing point of this eye pattern indicates that a signal passing through the zero-crossing point has an inclination which is proportional to a phase difference between the data and the data detection point.

This inclination has either a positive value or a negative value. Therefore, the decoder 415 detects a specific pattern in the reproduced signal by performing a predetermined logic operation in such a way as to make a discrimination between the positive and negative values of this inclination on the basis of the signal "s" and find if there is the zero-crossing point on the basis of the signal "ph". Therefore, the average level of the phase detection output 423 of the phase and amplitude detecting circuit 311 becomes a value proportional to the phase difference between the data detection point and the clock signal.

In obtaining the above-stated signals "s" and "ph", the embodiment of this invention is arranged to detect a specific pattern of the reproduced signal or data through a logic operation before outputting the signals "s" and "ph". FIG. 12 shows by way of example a truth table of the signals "s" and "ph".

FIG. 12 shows the output of the subtracter 411 which is expressed as "b-d" and the logic of the signals "s" and "ph" obtained for the reproduced data a, b, c, d and e. The signal "s" indicates whether the inclination of the output "b-d" is positive or negative. The signal "ph" indicates whether or not the output "b-d" is at the zero-crossing point. In other words, these signals indicate whether or not data of the specific pattern has been inputted. It is apparent from the truth table of FIG. 12 that the signals "s" and "ph" can be expressed by a simple logic operation. For example the signals "s" and "ph" can be expressed as follows:

$ph = (b \oplus d) + \overline{ace} + ace \quad s = c$ wherein $\oplus$ represents EXOR.

The above-stated logic is obtained in a case where there is no error in the integral-equalized data a, b, c, d and e. The phase detection output 423 shows a value which varies accordingly as the phases of the data and the clock signal deviate from each other. A phase discrepancy between the data and the clock signal causes the A/D converter 309 to perform sampling at an erroneous timing. However, the clock signal becomes synchronized in phase with the reproduced signal (data) with the phase detection output 423 supplied to the VCO 319 via the loop filter 313 as will be described later herein.

The amplitude detecting action of the embodiment is next described as follows.

As mentioned above, the PR4 data outputted from the subtracter 411 of FIG. 10 is in an eye pattern as shown in FIG. 11. Of the three values obtained at the data detection point, two values other than the zero-crossing point indicate the amplitude of the reproduced data. The embodiment is arranged to accurately detect the amplitude of the reproduced data obtained at the data detection point by detecting a specific pattern through the decoder 415 and by sampling and holding the data when the output of the subtracter 411 is at points other than the zero-crossing point.

Whether the output of the subtracter 411 is not at the zero-crossing point can be detected in a manner similar to the method of phase detection described above. More specifically, a specific pattern obtained when the output of the subtracter 411 is not at the zero-crossing point is detected by the decoder 415. Then, the signal "ah" thus obtained is supplied to the latch circuit 425. The latch circuit 425 then latches data coming from the switch 419 at the timing when the signal "ah" is inputted.

The logic of the signal "ah" is shown in FIG. 12 as "ah". The latch circuit 425 acts at the timing when the signal "ah" is at "0". Assuming that the MSBs of the outputs of the delay circuits 403 and 407 are b and d, the signal "ah" can be expressed as follows:

$$ah = \overline{b \oplus d}.$$

The switch 419 can be operated with the sign (MSB) of the PR4 data (data located in the middle of the data "b-d" of FIG. 10). However, as apparent from "sign" shown in FIG. 12, data obtained by inverting data d or b may be used for operating the switch 419.

Since the embodiment is arranged to obtain with a digital circuit a phase detection output-directly from the data obtained after the A/D conversion, the phase of the clock signal automatically follows the sampling point of the data, so that the data can be accurately detected.

Further, the embodiment is arranged to detect the amplitude of the reproduced signal from the reproduced data by detecting a specific pattern obtained when the PR4 data indicates some amplitude and by sampling and holding the PR4 data on the basis of the result of the detection. This process enables the embodiment to precisely detect the value of amplitude obtained at the sampling point, instead of the envelope of the reproduced signal. In other words, in detecting the reproduced data through the PR4 data as will be described later, the amplitude obtained at the data detection point can be accurately detected.

The amplitude detection output of the phase and amplitude detecting circuit 311 obtained in the above-stated manner is supplied to one input terminal of the subtracter 327. To the other input terminal of the subtracter 327 is supplied an amplitude target value from a register 329. The result of subtraction made by the subtracter 327 is supplied as an amplitude error to a loop filter 331. The loop filter 331 averages the amplitude error data. The averaged amplitude error data is supplied to the D/A converter 333 so as to be converted into an analog value. The analog amplitude error data is fed back to the VCA 307 to control the gain of the VCA 307.

Figure 13:
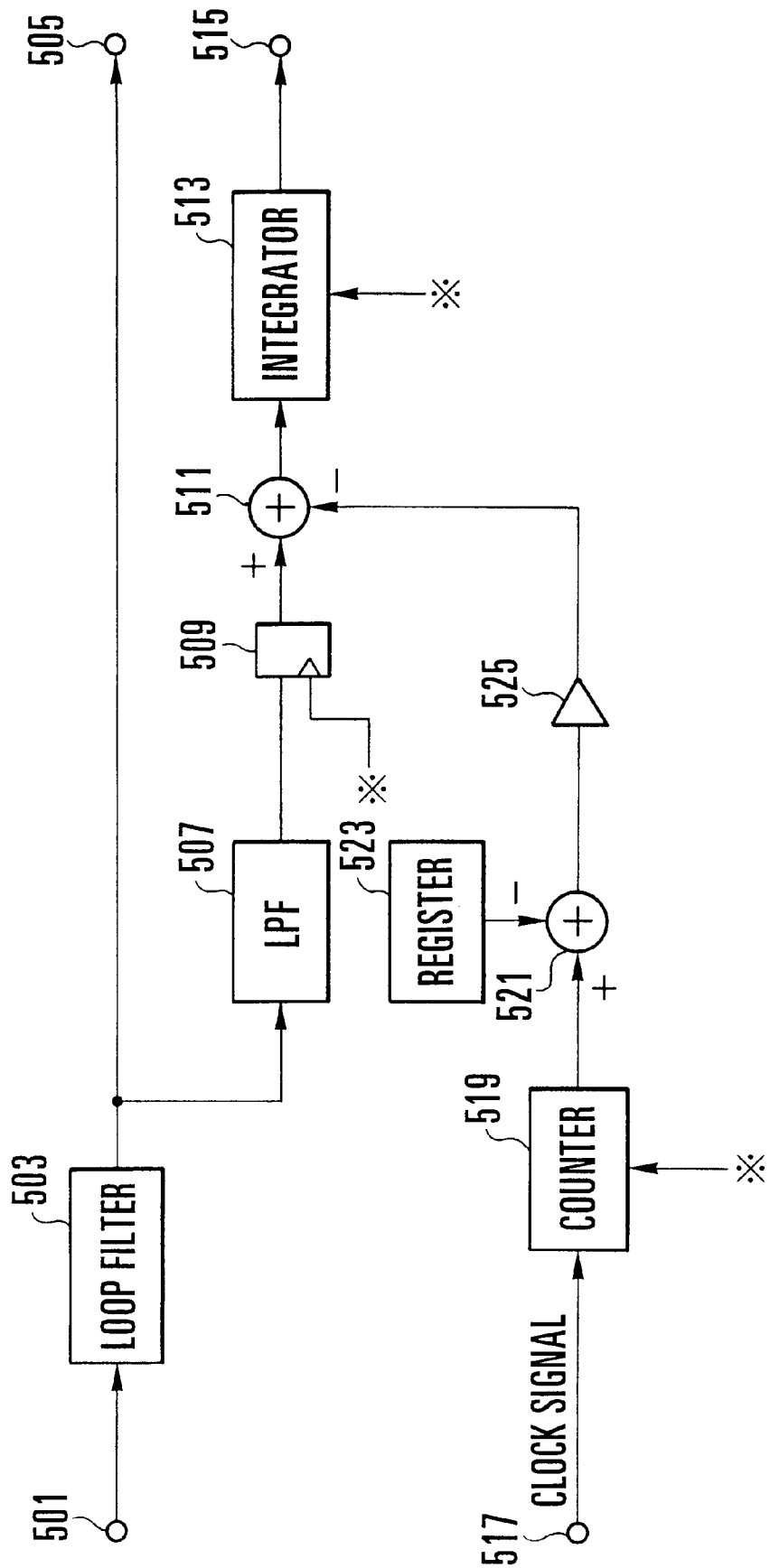
FIG. 13 is a block diagram showing the arrangement of a loop filter of the embodiment shown in FIG. 9.

Meanwhile, the phase detection output of the phase and amplitude detecting circuit 311 is supplied to the loop filter 313. The loop filter 313 which functions similarly to a part of the circuit shown in FIG. 6 is arranged to perform the PLL and AFC actions on the basis of the phase detection output in the same manner as described in the foregoing. The arrangement of the loop filter 313 is as shown in FIG. 13.

The PLL action of the loop filter 313 is first described as follows. Referring to FIG. 13, the phase detection output of the phase and amplitude detecting circuit 311 is supplied to an input terminal 501. A clock signal is supplied from the doubling circuit 321 to another input terminal 517. The phase detection output coming to the input terminal 501 is supplied to a loop filter 503 to be subjected to a filtering process and is then supplied from a terminal 505 to the D/A converter 315. The D/A converter 315 then converts the phase detection output into an analog signal. The analog signal is applied via the adder 318 to the VCO 319 to control the frequency of the clock signal generated by the VCO 319. A feedback loop is thus formed as the phase and amplitude detecting circuit 311—the loop filter 313—the adder 318—the VCO 319—the doubling circuit 321. This feedback loop is a basic loop of a PLL arrangement for generating a clock signal synchronized with the reproduced data.

Next, an automatic control over the oscillation frequency called the AFC action performed for keeping the PLL at the center of a lock range, following variations of temperature and variations due to aging, is described as follows.

The output of the loop filter 503 is supplied to the LPF 507. The LPF 507 averages the input data by integrating the data obtained during the one-track tracing period (hereinafter called the period "Ttr"). The average value of data thus obtained is supplied to a register 509. The register 509 holds the data coming from the LPF 507 at the timing of the period "Ttr" as shown in FIG. 14(b) and supplies the result of the holding action to a positive input terminal of a subtracter 511.

A timing signal which indicates the period "Ttr" is obtained, in this case, from a timing signal forming circuit 341 which is shown in FIG. 9. Referring to FIG. 9, the timing signal forming circuit 341 is arranged to form the timing signal indicating the period "Ttr" on the basis of a PG signal obtained by a PG head (not shown) which is arranged to detect the rotation phase of a rotary drum. FIG. 14(a) shows the envelope of a signal reproduced by the head 8. FIG. 14(b) shows the timing signal coming from the timing signal forming circuit 341.

The clock signal outputted from the doubling circuit 321 is supplied to a counter 519. The counter 519 then counts the number of pulses of the clock signal supplied during the period "Ttr". The result of the count is supplied to the positive input of a subtracter 521. The subtracter 521 then detects any deviation of the frequency of the clock signal from a target frequency by obtaining a difference between the count value of the counter 519 and the target value. The result of detection is supplied to a coefficient multiplier 525.

Assuming that the target frequency is expressed as "Fcent", a value expressed as "Fcent×Ttr" is set at the register 523. The error or deviation of the clock signal frequency from the target frequency thus can be obtained as a frequency error signal from the subtracter 521.

The frequency error signal outputted from the subtracter 521 is supplied to the coefficient multiplier 525 to have its level adjusted. The level-adjusted frequency error signal is supplied to the negative input terminal of the subtracter 511, The subtracter 511 then subtracts the output of the coefficient multiplier 525 from the output of the register 509 and supplies the result of subtraction to an integrator 513.

The arrangement of the integrator 513 is shown in FIG. 15. Referring to FIG. 15, within the integrator 513, an adder 601 is arranged to add up the input data and the data of a register 605 and to go on integrating the data as long as the integrated value is within a predetermined range of limit. Further, a limiter 603 is arranged to restrain the integrated value from exceeding the limit. The register 605 is provided with the signal indicating the period "Ttr" from the timing signal forming circuit 341 in the same manner as the register 509. The register 605 is thus arranged to hold the integrated value once per track.

The output of the integrator 513 is supplied via an output terminal 515 to the D/A converter 317. The D/A converter 317 converts the integrated value into an analog signal. The analog signal is supplied to the adder 318 and the equalizer 13.

With the fourth embodiment arranged in this manner, when the oscillation frequency of the VCO 319 happens to be lowered by some external factor, the frequency of the clock signal supplied via the doubling circuit 321 to the phase and amplitude detecting circuit 311 drops to cause the phase and amplitude detecting circuit 311 to give a signal indicating a phase difference. In response to the signal, the voltage of a control signal outputted from the D/A converter 315 varies accordingly to prompt the VCO 319 to enable the clock signal frequency to follow up the change by raising its oscillation frequency accordingly.

However, in a case where the frequency of the clock signal is varied following variations of phase, the data outputted from the loop filter 503 has already been raised or lowered and thus has already come out of the center of the lock range of the PLL. Therefore, an attempt to correct a phase difference between reproduced data and the clock signal under such a condition tends to have the PLL deviate from phase variations.

To solve the above-stated problem, the embodiment is arranged, like in the case of the embodiment described in the foregoing, to detect and integrate the deviation of the output data of the loop filter 503 through the path (route) composed of the LPF 507—the register 509—the integrator 513—the D/A converter 317—the adder 318 and to add the integrated deviation to the output of the D/A converter 315 at the adder 318. The deviation of the output data of the loop filter 503 thus can be absorbed by the integrator 513 by virtue of a time constant which is arranged to be slower than the time constant of the PLL. Therefore, the output data of the loop filter 503 can be kept near to the center of the lock range of the PLL.

Control over the equalizing characteristic of the equalizer of the embodiment is next described below.

FIG. 16 is a block diagram showing the arrangement of the equalizer 13. Referring to FIG. 16, a first-order filter 1 is composed of parts $R_1$, $R_2$, $R_3$, $L_1$ and an amplifier 1. A second-order filter 2 is composed of parts $R_4$, $L_2$, $C_2$ and an amplifier 2. A second-order filter 3 is composed of parts $R_5$, $L_3$, $C_3$ and an amplifier 3.

Figure 17:
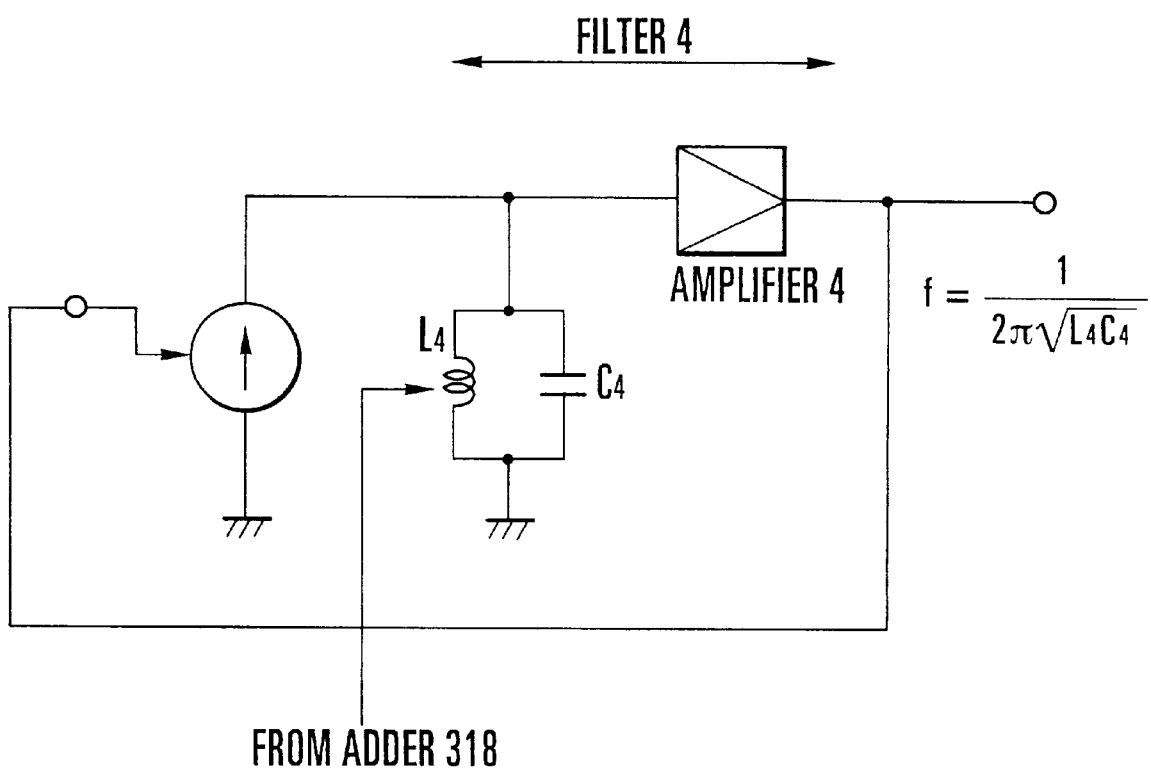
FIG. 17 shows the arrangement of a VCO included in the digital VTR shown in FIG. 9.

FIG. 17 shows the arrangement of the VCO 319. Referring to FIG. 17, a second-order filter 4 which is arranged to determine the oscillation frequency of the VCO 319 is composed of parts $L_4$, $C_4$ and an amplifier 4. An oscillation output is obtained by feeding back the output of the filter 4 to a current source.

The operation of the embodiment is described as follows. In the case of this embodiment, equivalent inductors $L_1$, $L_2$, $L_3$ and $L_4$ are formed by using gyrators which are formed on an integrated circuit in the same circuit form and to have the same mask arrangement, with capacitors $C_0$ (see FIG. 18) arranged as gyrator loads to equalize the inductances of these inductors.

Figure 18:
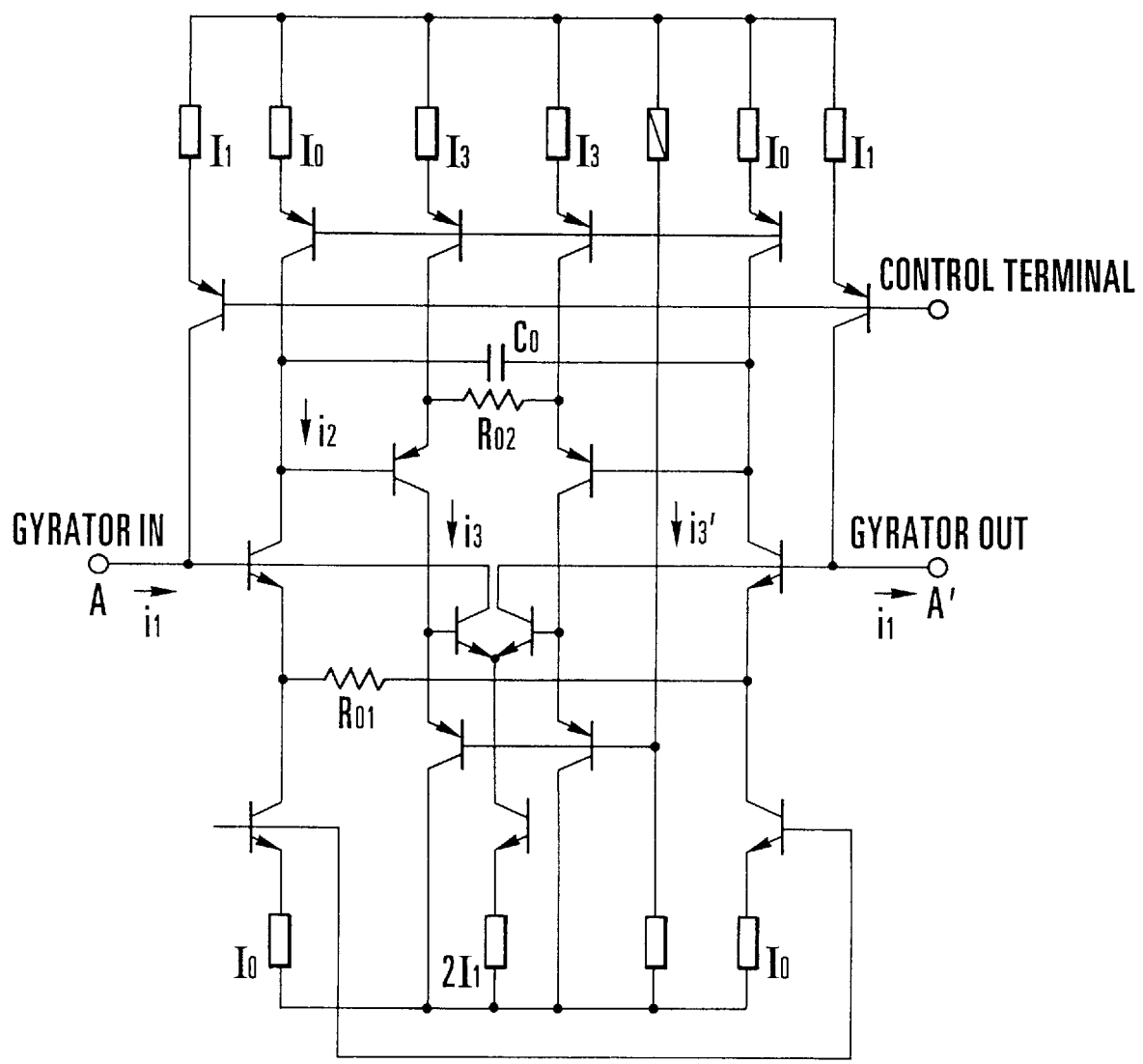
FIG. 18 shows the arrangement of a gyrator acting as an equalizing inductor in the circuits shown in FIGS. 16 and 17.

FIG. 18 shows by way of example the arrangement of the gyrator as the equivalent inductor. Referring to FIG. 18, a current $i_1$, flowing between terminals A and A' and a voltage $V_1$ between the two terminals A and A' are in a relation expressed in the following formula:

$$V_1 = j\omega C_0 \cdot R_{01} \cdot R_{02} \cdot (I_3/I_1) \cdot i_1$$

wherein $I_1$ and $I_3$ represent direct currents, and $i_1$ represents an alternating current.

From the above equation, the following formula is derived:

$$L = C_0 \cdot R_{01} \cdot R_{02} \cdot (I_3/I_1).$$

Therefore, an inductor L can be formed on an integrated circuit by using registers R and a capacitor C. The value L can be made variable with the value $I_3$ arranged to be fixed and the value $I_1$ to be variable.

With regard to the characteristics of the filters 1, 2 and 3, the values of resistors and capacitors are set in such a way as to have their cutoff frequencies and quality factors (Q) to become as shown in FIGS. 19(a), 19(b) and 19(c), with the gyrators assumed to have reference currents at their center values.

The transmission band of a reproduction equalizer is arranged, in this case, to be about ½ of a signal transmission speed (reproduced clock signal frequency) fb which satisfies the Nyquist standards known as a signal transmission theorem.

Figure 20:
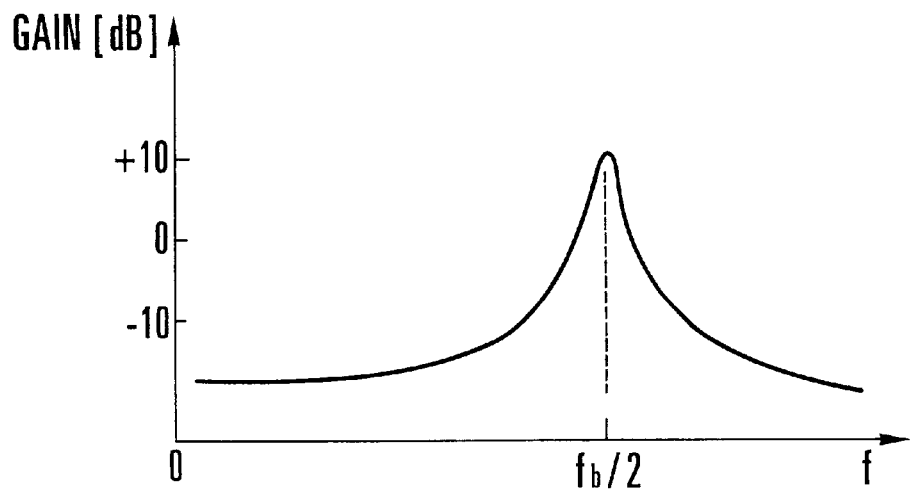
FIG. 20 shows the characteristic of the circuit of FIG. 17.

As for the frequency characteristic of the filter 4 which determines the oscillation frequency of the VCO 319, it has a sharp peak at fb/2, with the gyrator assumed to have a reference value at its center value, as shown in FIG. 20. It is thus apparent that the VCO 319 oscillates with its center frequency at fb/2.

A normal reproducing action of the digital VTR is performed as described below.

At the commencement of the reproducing action, the frequency of the clock signal is adjusted to that of the reproduced data by the AFC loop. The frequency thus adjusted is set within the lock range of the PLL. After that, the phase and amplitude detecting circuit 311 acts to detect a phase difference between the reproduced data equalized by the equalizer 13 and the clock signal. Then, a phase detection signal thus obtained is negatively fed back to the VCO 319 through the loop filter 313, the D/A converter 315 and the adder 318. Therefore, the oscillation frequency of the VCO 319 which is determined by the cutoff frequency of the filter 4 is automatically adjusted to the value fb/2.

With the values of the capacitors $C_3$ and $C_4$ for the filters 3 and 4 arranged to be equal to each other, the cutoff frequency of the filter 3 can be kept at the value fb/2 including the stray capacity of the gyrator. Then, with the output of the filter 3 used as a reference value, the value of the capacitor $C_2$ which is to be handled for the filter 2 can be easily obtained.

In the case of this embodiment, the equivalent inductances obtained by the gyrators of identical circuit forms are used for the filters forming the equalizer 13 and the VCO 319. Then, the cutoff frequency of the filters is controlled by controlling these gyrators with the same reference current as a reference current used for control over the VCO 319. The equalizing characteristic of the equalizer, therefore, can be automatically controlled according to variations taking place in the clock signal.

Figure 21:
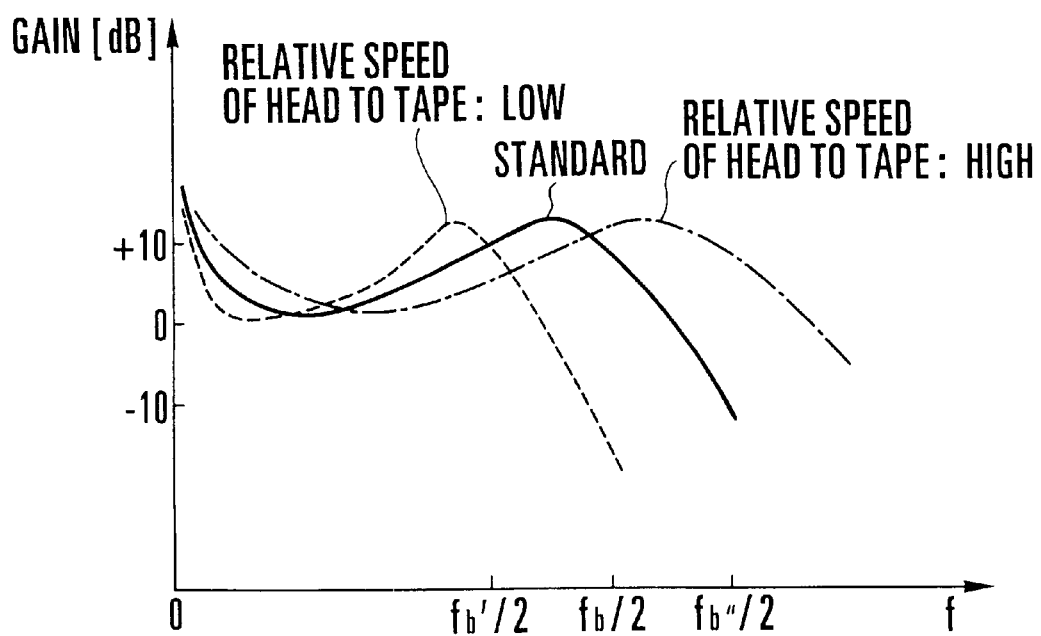
FIG. 21 also shows the characteristic of the circuit of FIG. 16.

Further, as mentioned in the foregoing, the frequency of a reproduced signal varies in the event of a special reproduction. In the case of the embodiment, however, the clock signal output from the doubling circuit 321 can be brought near to the frequency of the reproduced signal by changing the setting value of the register 523 to vary the oscillation frequency of the VCO 319. When the PLL follows up the change under such a condition, any deviation of the phase detection output can be absorbed by the integrator 513 in such a way as to bring the output of the loop filter 503 toward the center of the lock range of the PLL. At this time, the equalizing characteristic of the equalizer 13 is controlled by the output of the D/A converter 317 which determines the center frequency of the VCO 319. The embodiment is, therefore, capable of automatically controlling the equalizing characteristic of the equalizer 13 according to variations taking place in the frequency of the reproduced signal as shown in FIG. 21.

In this embodiment, the VCO 319 is controlled by the sum of the outputs of the D/A converters 315 and 317. The equalizer 13 is, on the other hand, controlled by the output of the D/A converter 317 alone.

The frequency of the signal outputted from the D/A converter 315 is normally of the order of several kHz. If the output of the D/A converter 315 is supplied to the gyrator of the equalizer 13 as it is, some noise might come to mix in the reproduced data.

In the case of this embodiment, such a noise is prevented from mixing in by controlling the equalizer 13 with the output of the D/A converter 317 which has a relatively low frequency, as the frequency of the signal which is outputted from the timing signal forming circuit 341 to indicate the period "Ttr" is 300 Hz, because one frame consists of ten tracks.

As described above, in this embodiment, the VCO and the equalizer are integrally formed in one and the same integrated circuit with gyrators which are in identical circuit forms and have the same mask arrangement, the equalizer is controlled with a signal which is obtained by integrating the phase detection output, and the VCO is controlled by a sum of the phase detection output and the integration output. Therefore, the PLL can be kept at the center of its lock range and variations of the clock signal caused by variations of temperature and aging can be adequately compensated for.

The equalizing characteristic of the equalizer is controlled by the AFC loop while the VCO is controlled by the AFC loop and the PLL. Therefore, the equalizing characteristic of the equalizer can be c ontrolled to caus e the frequency of t he clock signal to follow up variations of frequency of the reproduced signal. The nonuniformity of the analog integrated circuit which is composed of the equalizer and the VCO due to variations of temperature and due to lot production can be absorbed to always ensure an optimum equalizing characteristic.

Further, the arrangement of the LPF 507—the integrator 513 and the counter 519—the coefficient multiplier 525 shown in FIG. 13 may be replaced with a microcomputer arranged, for example, as shown in FIG. 7.

In the case of FIG. 9, the output of the loop filter 503 and that of the integrator 513 are arranged to be converted into analog signals respectively by the D/A converters 315 and 317 before they are added together. This arrangement, however, may be changed to arrange the adder 318 as a digital adder, to add together the outputs of the loop filter 503 and the integrator 513 while they are in the states of digital signals, to convert the result of addition into an analog signal and to supply the result of addition to the VCO 319.

While, in the embodiments described, the characteristic of the equalizer is controlled by causing the VCO 319 to oscillate at a desired frequency, the circuit arrangement may be replaced with any other circuit arrangement as long as it is of the same circuit form as that of the embodiment and formed in an integrated circuit.

In the case of the embodiments described, this invention is applied to a digital VTR. However, this invention is not limited to digital VTRs. The same advantageous effects as those of the embodiment described are attainable by applying this invention to other systems arranged to transmit, record and reproduce digital signals, such as communication and optical disk systems using radio waves and light, etc.

The arrangement described above of controlling the equalizing characteristic by using a frequency difference between the reproduced data and the clock signal and of controlling the oscillating action by using a phase difference between the reproduced data and the clock signal makes it possible to most appositely control the equalizing characteristic according to variations taking place in the clock signal.

The arrangement described above of controlling the equalizing characteristic by using the result of detection of a trend of a phase difference between the reproduced data and the clock signal and of controlling the oscillating action by using the trend detected and a phase difference between the reproduced data and the clock signal also makes it possible to adequately control the equalizing characteristic according to variations taking place in the clock signal.

Since the response speed of the control over the equalizing characteristic can be arranged to be slower than the response speed of the control over the oscillating action, noises can be prevented from mixing in the reproduced data.

Figure 22:
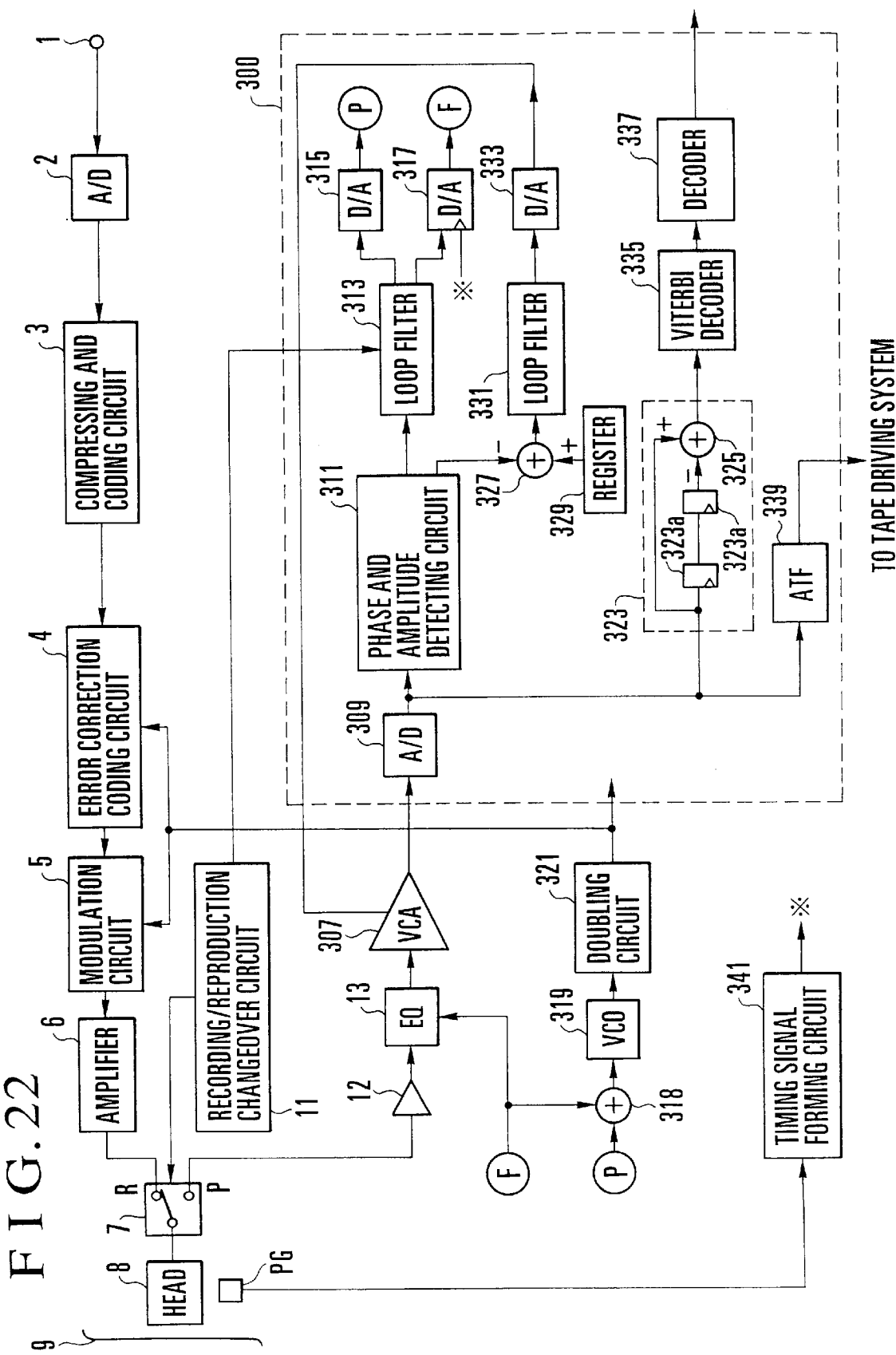
FIG. 22 shows the arrangement of a digital VTR which is a further embodiment of this invention.

FIG. 22 shows the arrangement of a digital VTR in which the clock signal generating circuit included in the apparatus shown in FIG. 9 is used for the generation of the operation clock signal of the recording system shown in FIG. 2.

In the case of FIG. 22, the action of the loop filter 313 is controlled by the recording/reproduction changeover circuit 11 in generating the operation clock signal at the time of recording.

Figure 23:
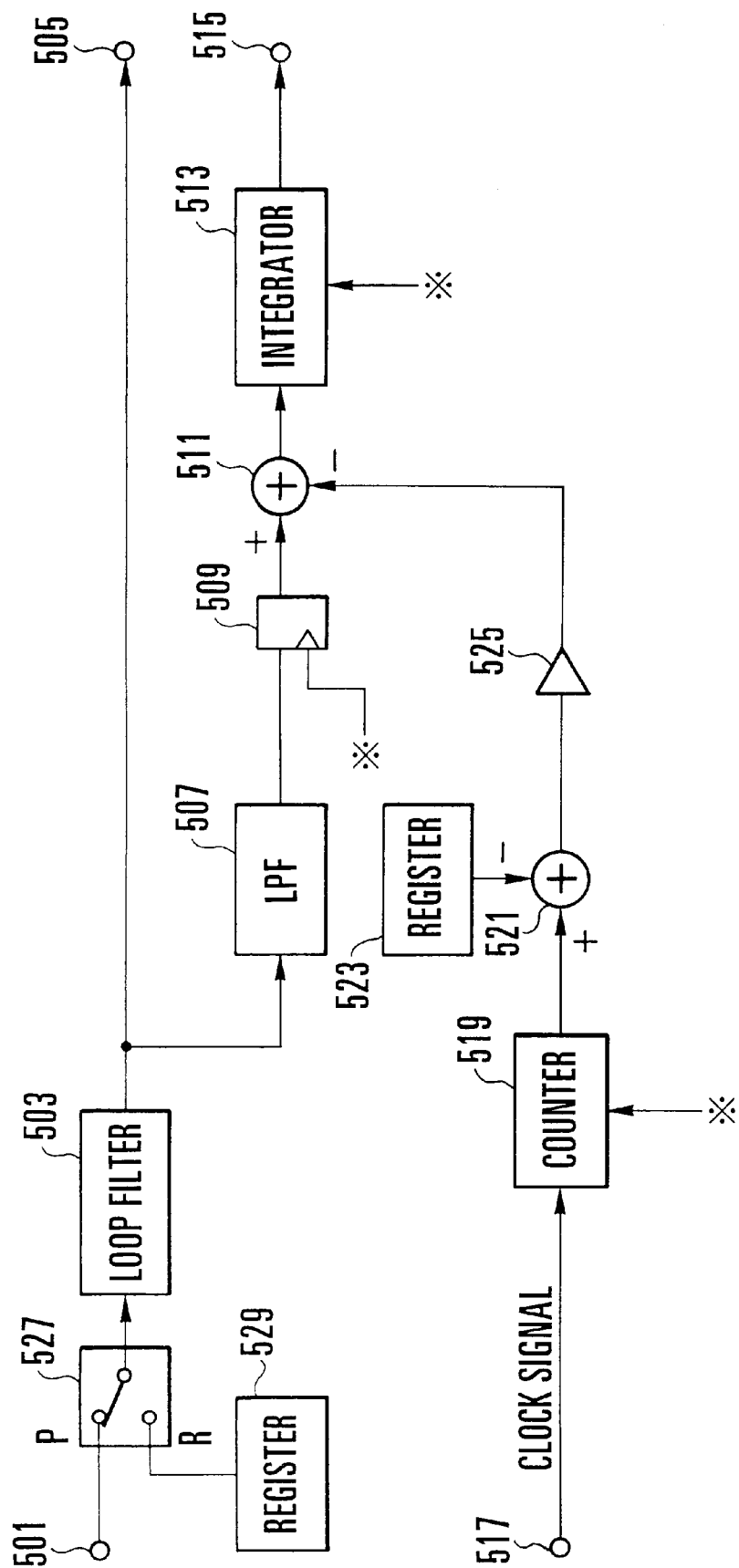
FIG. 23 shows the arrangement of a loop filter included in the embodiment shown in FIG. 22.

In this case, the loop filter 313 is configured, for example as shown in FIG. 23, to be provided with a switch 527 for change-over between recording and reproduction. In the case of reproduction, the position of the switch 527 is on one side P to supply the phase detection output to the loop filter 503. In the case of recording, the position of the switch 527 is on the other side R to supply digital data indicating that there is no phase difference from a register 529 to the loop filter 503.

In FIG. 22, the phase and amplitude detecting circuit 311, the loop filter 313, the D/A converters 315 and 317, the adder 318, the VCO 319 and the doubling circuit 321 jointly form a clock signal generating circuit. The parts other than these parts are arranged to act in the same manner as the embodiments described in the foregoing.

What is claimed is:

1. A reproducing apparatus comprising:
   a) reproducing means for reproducing data;
   b) generating means for generating a clock signal;
   c) frequency detecting means for detecting a difference between a frequency of the clock signal generated by said generating means and a predetermined frequency;
   d) equalizing means for equalizing the reproduced data, an equalizing characteristic of said equalizing means being controlled according to an output of said frequency detecting means; and
   e) phase difference detecting means for detecting a phase difference between the clock signal generated by said generating means and the reproduced data,
   a clock signal generating operation of said generating means being controlled according to the output of said frequency detecting means and an output of said phase difference detecting means.

2. An apparatus according to claim 1, wherein said frequency detecting means includes a counter for counting the clock signal, a register for holding a comparison value corresponding to the predetermined frequency, error detecting means for obtaining a difference between an output of said counter and the comparison value, and an integrating circuit for integrating an output of said error detecting means, and wherein the equalizing characteristic of said equalizing means is controlled according to an output of said integrating circuit.

3. An apparatus according to claim 2, wherein the comparison value is a value corresponding to a frequency of the reproduced data.

4. An apparatus according to claim 1, further comprising an adder for adding together the output of said frequency detecting means and the output of said phase difference detecting means, and where in said generating means is controlled according to an output of said adder.

5. An apparatus according to claim 4, wherein said phase difference detecting means includes a phase detector for detecting a phase difference between the clock signal and the reproduced data and outputting the phase difference as digital data and first conversion means for converting the digital data outputted from said phase detector into analog data, wherein said frequency detecting means includes a frequency detector for detecting a difference between a frequency of the clock signal and a frequency of the reproduced data and outputting the difference as digital data and second conversion means for converting the digital data outputted from said frequency detector into analog data, and wherein said adder adds together an output of said first conversion means and an output of said second conversion means.

6. An apparatus according to claim 1, wherein said equalizing means and said generating means respectively include filters which are of the same circuit form, a characteristic of each of the filters of said equalizing means and said generating means is controllable.

7. An apparatus according to claim 1, further comprising conversion means for sampling the reproduced data equalized by said equalizing means according to the clock signal and outputting the sampled data as digital data, and wherein said phase difference detecting means includes pattern detecting means for detecting a specific pattern in the digital data outputted from said conversion means, extracting means for extracting a part of the digital data at a timing corresponding to an output of said pattern detecting means and means for detecting the phase difference according to an output of said extracting means.

8. An apparatus according to claim 7, wherein said conversion means converts the reproduced data into digital data composed of a plurality of bits per sample.

9. A reproducing apparatus arranged to generate a clock signal synchronized in phase with reproduced data equalized by an equalizer, characterized in that:

an equalizing characteristic of said equalizer is controlled on the basis of a difference between a frequency of the reproduced data and a frequency of the clock signal; and an operation of generating the clock signal is controlled on the basis of a phase difference between the reproduced data and the clock signal.

10. An apparatus according to claim 9, wherein the operation of generating the clock signal is controlled on the basis of the phase difference and the difference between the frequency of the reproduced data and the frequency of the clock signal.

11. An apparatus according to claim 9, wherein digital data is obtained by sampling the reproduced data equalized by said equalizer according to the clock signal.

12. A reproducing apparatus comprising:
a) reproducing means for reproducing data;
b) generating means for generating a clock signal;
c) phase difference detecting means for detecting a phase difference between the clock signal generated by said generating means and the reproduced data; and
d) equalizing means for equalizing the reproduced data, an equalizing characteristic of said equalizing means being controlled according to a low frequency component of a phase difference detection output of said phase difference detecting means, and
a clock signal generating operation of said generating means being controlled according to a high frequency component and a low frequency component of the phase difference detection output of said phase difference detecting means.

13. An apparatus according to claim 12, wherein said phase difference detecting means includes an integrating circuit for integrating the phase difference detection output, and wherein the equalizing characteristic of said equalizing means is controlled according to an output of said integrating circuit and the clock signal generating operation of said generating means is controlled according to the output of said phase difference detecting means and the output of said integrating circuit.

14. An apparatus according to claim 13, wherein said phase difference detecting means further includes a loop filter for receiving the phase difference detection output, averaging means for averaging an output of said loop filter, and latch means for latching an output of said averaging means and outputting the latched output to said integrating circuit.

15. An apparatus according to claim 13, wherein the phase difference detection output and the output of said integrating circuit are obtained respectively as digital data, wherein said phase difference detecting means further includes first conversion means for converting the phase difference detection output into analog data and second conversion means for converting the output of said integrating circuit into analog data, and wherein the equalizing characteristic of said equalizing means is controlled according to an output of said second conversion means and the clock signal generating operation of said generating means is controlled according to an output of said first conversion means and the output of said second conversion means.

16. An apparatus according to claim 15, further comprising an adder for adding together the output of said first conversion means and the output of said second conversion means, and wherein the clock signal generating operation of said generating means is controlled according to an output of said adder.

17. A clock signal generating device comprising:
a) generating means for generating a clock signal;
b) a first loop including phase difference detecting means for detecting a phase difference between the clock signal and input data and a filter for filtering an output of said phase difference detecting means and feeding back the filtered output to said generating means;
c) a second loop including computation means for obtaining a difference between a frequency of the clock signal and a target frequency and accumulation means for accumulating an output of said computation means and feeding back the accumulated output to said generating means; and
d) control means for manually controlling whether or not said first loop is to be operated.

18. A device according to claim 17, further comprising recording/reproducing means for recording and reproducing an information signal, and wherein said control means controls said first loop in such a manner that both said first loop and said second loop are operated in reproducing the information signal and only said second loop is operated in recording the information signal.

19. A device according to claim 17, wherein said first loop further includes detecting means for detecting a trend of an output of said filter and outputting a signal indicative of the trend and an adder for adding together the output of said filter and an output of said detecting means, and feeds back an output of said adder to said generating means.

20. A device according to claim 19, wherein said detecting means includes a low-pass filter for suppressing a high frequency band component of the output of said filter and said accumulation means, and wherein said accumulation means accumulates also an output of said low-pass filter and outputs the accumulated output to said adder.

21. A device according to claim 20, wherein said first loop further includes a subtracter for obtaining a difference between the output of said low-pass filter and the output of said computation means, and wherein said accumulation means accumulates an output of said subtracter and outputs the accumulated output to said adder.

22. A clock signal generating device for generating with a voltage-controlled oscillator a clock signal to be used in recording and reproducing an information signal, characterized in that:

a generating operation for the clock signal is controlled by a phase control loop arranged to detect a phase difference between a reproduced information signal and the clock signal, to perform a filtering process on the detected phase difference and to feed back the filtered phase difference to said voltage-controlled oscillator, and a frequency control loop arranged to detect a frequency difference between a frequency of the clock signal and a frequency of the reproduced information signal, to integrate the detected frequency difference and to feed back the integrated frequency difference to said voltage-controlled oscillator, and both said phase control loop and said frequency control loop are operated in reproducing the information signal, and only said frequency control loop is operated in recording the information signal.

* * * * *

UNITED STATES PATENT AND TRADEMARK OFFICE
CERTIFICATE OF CORRECTION

PATENT NO. : 5,923,707
DATED : July 13, 1999
INVENTOR(S) : Yasuyuki Tanaka, et al.

It is certified that error appears in the above-identified patent and that said Letters Patent is hereby corrected as shown below:

Col. 15, line 11, delete "output-directly" and insert -- out directly --.
Col. 19, lines 16-17, delete "can be c ontrolled to caus e the frequency of t he" and insert -- can be controlled to cause the frequency of the --.

Signed and Sealed this

Thirteenth Day of February, 2001

Attest:

NICHOLAS P. GODICI

Attesting Officer      Acting Director of the United States Patent and Trademark Office